United States Patent
Takegami

(10) Patent No.: US 9,315,653 B2
(45) Date of Patent: Apr. 19, 2016

(54) METHOD OF PRODUCING A POLYESTER RESIN COMPOSITION

(71) Applicant: FUJIFILM Corporation, Tokyo (JP)

(72) Inventor: Ryuta Takegami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/223,313

(22) Filed: Mar. 24, 2014

(65) Prior Publication Data

US 2014/0206797 A1     Jul. 24, 2014

Related U.S. Application Data

(62) Division of application No. 13/042,994, filed on Mar. 8, 2011, now abandoned.

(30) Foreign Application Priority Data

Mar. 9, 2010 (JP) .................................. 2010-052144
Feb. 21, 2011 (JP) .................................. 2011-034930

(51) Int. Cl.

| | |
|---|---|
| C08G 63/00 | (2006.01) |
| C08K 5/521 | (2006.01) |
| C08G 63/80 | (2006.01) |
| C08G 63/85 | (2006.01) |
| C08J 5/18 | (2006.01) |
| C08K 5/00 | (2006.01) |
| H01L 31/048 | (2014.01) |

(52) U.S. Cl.
CPC ................. *C08K 5/521* (2013.01); *C08G 63/80* (2013.01); *C08G 63/85* (2013.01); *C08J 5/18* (2013.01); *C08K 5/0091* (2013.01); *H01L 31/048* (2013.01); *C08J 2367/02* (2013.01); *Y02E 10/50* (2013.01)

(58) Field of Classification Search
CPC ........ C08G 63/80; C08G 63/83; C08G 63/85; C08G 63/87
See application file for complete search history.

(56) References Cited

U.S. PATENT DOCUMENTS

| | | | |
|---|---|---|---|
| 7,834,128 B2 | 11/2010 | Fujimori et al. | |
| 2009/0076242 A1* | 3/2009 | Higashijima et al. | ......... 528/279 |
| 2009/0242026 A1 | 10/2009 | Miyaji et al. | |
| 2010/0305296 A1 | 12/2010 | Qi et al. | |

FOREIGN PATENT DOCUMENTS

| | | |
|---|---|---|
| EP | 1 602 679 | 12/2005 |
| EP | 2 006 315 | 12/2008 |
| EP | 2 091 087 | 8/2009 |
| JP | 2002-179781 | 6/2002 |
| JP | 3396995 | 4/2003 |
| JP | 2003-221437 | 8/2003 |
| JP | 2004-019075 | 1/2004 |
| JP | 3685042 | 8/2005 |
| JP | 2006-16423 | 1/2006 |
| JP | 2007-204538 | 8/2007 |
| JP | 2007-211035 | 8/2007 |
| JP | 4196795 | 12/2008 |
| JP | 2009-24088 | 2/2009 |
| JP | 2009-024088 | 2/2009 |
| WO | WO 2007072893 A1 * | 6/2007 |

OTHER PUBLICATIONS

Machine translation of JP 2007/211035, 2007.*
Japanese Office Action dated Oct. 8, 2013 in corresponding Japanese Patent Application No. 2011-034930 with English translation of Japanese Office Action.
Japanese Office Action issued Oct. 8, 2013; Patent Application No. 2011-034930; Reference No. 11F0004; Mailing No. 65354.
Machine translation of JP 2007-204538.
Chinese Office Action dated Dec. 27, 2013 for Application No. 201110058268.7.

* cited by examiner

*Primary Examiner* — Wenwen Cai
(74) *Attorney, Agent, or Firm* — Young & Thompson

(57) ABSTRACT

A polyester resin composition including: a polyester resin; a titanium compound derived from a catalyst; and a phosphorous compound, wherein formula (1): $0.10 < Ti/P < 0.20$ is satisfied wherein Ti/P represents a mass content ratio of titanium element to phosphorus element in the polyester resin composition, and formula (2): $0.0090 < \Delta IV \leq 0.0185$ (dL/g/hr) is satisfied wherein $\Delta IV$ represents an increase in an intrinsic viscosity of the polyester resin composition per hour under conditions of 225° C. and 50 Pa.

9 Claims, 1 Drawing Sheet

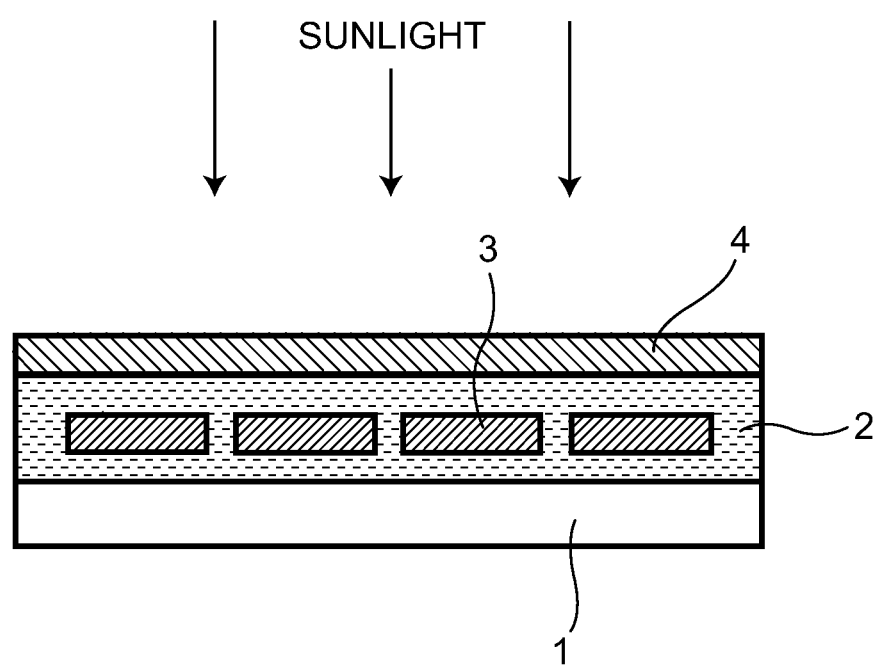

METHOD OF PRODUCING A POLYESTER RESIN COMPOSITION

CROSS-REFERENCE TO RELATED APPLICATION

This application is a division of application Ser. No. 13/042,994 filed on Mar. 8, 2011, which claims priority under 35 USC 119 from Japanese Patent Application No. 2010-052144 filed on Mar. 9, 2010 and Japanese Patent Application No. 2011-034930 filed on Feb. 21, 2011, the disclosures of which are incorporated by reference herein.

BACKGROUND OF THE INVENTION

1. Field of the Invention

The present invention relates to a polyester resin composition and a method of producing the same, a polyester film, and a solar cell power generation module.

2. Description of the Related Art

Polyester resin is widely used in various fields because of the mechanical properties, heat resistance, and electrical properties thereof. For instance, a film prepared by using polyester resin is applicable to outdoor uses such as a solar cell power generation module, a lighting film, or an agriculture sheet. In these application modes, the film is required to have a high weather resistance because it is placed in such an environment where it is constantly exposed to wind and rain.

Particularly in recent years, from the viewpoint of preserving the global environment, photovoltaic power generation converting sunlight into electricity has drawn attention. A solar cell module used for the photovoltaic power generation has a structure including a (sealing material), solar cell devices, a sealing material, and a backsheet that are stacked in this order on a glass substrate through which sun light enters.

The solar cell power generation module is required to have a high weather-proof performance of securing cell performances such as power generation efficiency over a long period of time, several tens of years, even in a hard use environment where the module is exposed to wind and rain or direct sunlight. In order to impart such weather-proof performance, respective materials that compose the solar cell power generation module, including a backsheet and a sealing material that seals the devices, are also required to have weather resistance.

For the backsheet included in the solar cell power generation module, generally a resinous material such as polyester resin is used. Polyester tends to degrade with time because the terminal carboxy groups thereof work as a self-catalyst, causing easily hydrolysis in an environment where water exists. For this reason, a polyester resin that is used for the solar cell power generation module installed in such an environment as outdoors where it is exposed constantly to wind and rain is requested to suppress the hydrolysis property thereof.

A polyester resin that is used for outdoor applications other than the solar cell power generation module is also requested to suppress the hydrolysis property.

As a polymerization method of polyester resin, a polymerization method using an antimony catalyst has been mainly studied, but there is an attempt to use a titanium catalyst that is environmentally-compatible. Regarding a polyester resin composition prepared by using a titanium catalyst and a polyester resin film obtained from the composition, Japanese Patent Application Laid-Open (JP-A) No. 2007-204538 discloses providing a polyester film having improved environmental resistances such as hydrolysis resistance and weather resistance by using a titanium catalyst and a phosphorous compound and regulating the amount thereof. Further, JP-A No. 2004-19075 discloses a polyester resin composition and a film thereof, which are prepared by using a titanium catalyst and a phosphorus compound and are reduced in foreign substances derived from the catalyst. A heat resisting polyester film prepared by using a titanium catalyst and a phosphorus compound is disclosed in reference example 2 of Japanese Patent No. 3396995.

However, the problem is that the polyester films disclosed in JP-A Nos. 2007-204538 and 2004-19075 and Japanese Patent No. 3396995 are insufficient in hydrolysis resistance and productivity. Further, when the polyester films are used for the solar cell power generation module, there is also another problem of insufficient withstanding voltage.

SUMMARY OF THE INVENTION

According to an aspect of the invention, there is provided a polyester resin composition comprising: a polyester resin; a titanium compound derived from a catalyst; and a phosphorous compound, wherein the following formula (1) and formula (2) are satisfied:

$$0.10 < Ti/P < 0.20 \quad (1)$$

wherein Ti/P represents a mass content ratio of titanium element to phosphorus element in the polyester resin composition $$0.0090 < \Delta IV \leq 0.0185 (dL/g/hr) \quad (2)$$

wherein $\Delta IV$ represents an increase in an intrinsic viscosity of the polyester resin composition per hour under conditions of 225° C. and 50 Pa.

BRIEF DESCRIPTION OF THE DRAWINGS

FIG. 1 is a schematic cross-sectional view showing a configuration example of a solar cell power generation module.

DETAILED DESCRIPTION OF THE INVENTION

Hereinafter, a polyester resin composition of the present invention and a method of producing the same, a polyester film, and a solar cell power generation module using the polyester film will be described in detail.

Polyester Resin Composition and Method of Producing the Same

The polyester resin composition of the present invention includes therein a polyester resin, a titanium compound derived from a catalyst, and a phosphorus compound, wherein the following formulas (1) and (2) are satisfied.

$$0.10 < Ti/P < 0.20 \quad (1)$$

In formula (1), Ti/P represents a mass content ratio of titanium element to phosphorus element in the polyester resin composition.

$$0.0090 < \Delta IV \leq 0.0185 (dL/g/hr) \quad (2)$$

In formula (2), $\Delta IV$ represents an increase in an intrinsic viscosity of the polyester resin composition per hour under conditions of 225° C. and 50 Pa.

The titanium compound, which is used as a catalyst in the production of the polyester resin composition of the present invention, is high in catalytic activity of esterification reaction and transesterification reaction and also has catalytic activity of hydrolysis reaction (reverse reaction of esterification reaction). Because of this, when the titanium compound derived from the catalyst is included in the polyester resin composition while the titanium compound is still catalytically active, hydrolysis of the polyester resin that is included in the composition tends to be accelerated.

It is considered that in the present invention, the phosphorus compound is included along with the titanium compound derived from a catalyst, and formulas (1) and (2) are satisfied, so that the catalytic activity of the titanium compound included in the polyester resin composition is inactivated sufficiently, and the hydrolysis resistance is increased. Formula (2) serves as an index that indicates inactivation of the catalytic activity, and smaller ΔIV value means that the hydrolysis resistance is further improved.

Further, in the polyester resin composition of the invention, the catalytic activity of the titaniumu compound can be particularly effectively inactivated through the preferable production method (production method of the invention) in which an appropriate amount of a phosphorous compound is added at appropriate timing during melt polymerization. Therefore, although the polyester resin composition of the invention includes a titanium compound derived from a catalyst, the polyester resin composition has extremely high hydrolysis resistance.

The polyester resin composition of the present invention is required to satisfy formula (1). The content ratio of titanium element to phosphorus element (Ti/P) in the polyester resin composition is more preferably from 0.11 to 0.19 and still more preferably from 0.13 to 0.17. When formula (1) is not satisfied, that is, Ti/P is 0.10 or less, inactivation of the catalytic activity of the titanium compound by the phosphorus compound becomes excess, whereby polymerization speed lowers largely, and as a result, productivity lowers. When Ti/P is 0.20 or more, inactivation of the catalytic activity of the titanium compound by the phosphorus compound becomes insufficient. Thereby polymerization speed is high, but the catalytic activity of the titanium compound also remains high in the resulting polyester resin composition. As a result, hydrolysis resistance of the polyester resin composition is degraded.

The polyester resin composition of the present invention is required to satisfy not only formula (1) but also formula (2). Formula (2) serves as an index that indicates inactivation of the catalytic activity of the titanium compound included in the polyester resin composition.

The increase (ΔIV) in an intrinsic viscosity represented by formula (2) is required to be more than 0.0090 (dL/g/hr) but 0.0185 (dL/g/hr) or less, more preferably from 0.0165 to 0.0183, and still more preferably from 0.0170 to 0.0182.

The intrinsic viscosity (IV: Intrinsic Viscosity) used herein represents a value given by extrapolation to zero concentration of a value given by dividing specific viscosity ($\eta_{sp}=\eta_r-1$) by concentration; wherein the specific viscosity is given by subtracting 1 from $\eta_r$ ($=\eta/\eta_0$: relative viscosity), which is a ratio of solution viscosity ($\eta$) to solvent viscosity ($\eta_0$). IV may be obtained from a solution viscosity measured at 25° C. in a mixed solvent of 1,1,2,2-tetrachloroethane and phenol (=2/3 by mass ratio).

The increase (ΔIV) in an intrinsic viscosity described herein is calculated as: ΔIV={IV(after solid-state polymerization)−IV(before solid-state polymerization)}/30, wherein IV (after solid-state polymerization) is a value obtained after solid-state polymerization has been performed for 30 hours under conditions of 225° C. and 50 Pa.

The polyester resin that is included in the polyester resin composition of the present invention may be obtained by condensation polymerization using a dicarboxylic acid component and a diol component as raw materials.

Details of a preferred method of producing the polyester resin composition of the present invention (a method of producing a polyester resin composition of the present invention) will be described later.

Examples of the dicarboxylic acid component that is used as a raw material of the polyester resin include: aliphatic dicarboxylic acids; alicyclic dicarboxylic acids; aromatic dicarboxylic acids; and ester derivatives thereof. The aliphatic dicarboxylic acids include malonic acid, succinic acid, glutaric acid, adipic acid, suberic acid, sebacic acid, dodecanedionic acid, dimer acid, eicosane dionic acid, pimelic acid, azelaic acid, methylmalonic acid, and ethylmalonic acid. The alicyclic dicarboxylic acids include adamantane dicarboxylic acid, norbornene dicarboxylic acid, isosorbide, cyclohexane dicarboxylic acid, and decalin dicarboxylic acid. The aromatic dicarboxylic acids include terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic acid, 4,4'-diphenyl dicarboxylic acid, 4,4'-diphenylether dicarboxylic acid, 5-sodium sulfoisophthalic acid, phenylindane dicarboxylic acid, anthracene dicarboxylic acid, phenanthrene dicarboxylic acid, and 9,9'-bis(4-carboxyphenyl)fluorenic acid.

As the dicarboxylic acid component, at least one kind of aromatic dicarboxylic acid is preferably used. More preferably, an aromatic dicarboxylic acid is included as a main component in the dicarboxylic acid component. Note that, "main component" denotes that the ratio of aromatic dicarboxylic acid in the dicarboxylic acid component is 80% by mass or more.

Examples of the diol component that is used as a raw material for the polyester resin include: aliphatic diols such as ethylene glycol, 1,2-propane diol, 1,3-propane diol, 1,4-butane diol, 1,2-butane diol, or 1,3-butane diol; alicyclic diols such as cyclohexane dimethanol, spiro glycol, or isosorbide; and aromatic diols such as bisphenol A, 1,3-benzene dimethanol, 1,4-benzene dimethanol, or 9,9'-bis(4-hydroxyphenyl)fluorene.

As the diol component, at least one kind of aliphatic diol is preferably used. The aliphatic diol may be ethylene glycol, which is preferably included as a main component. Note that, "main component" denotes that the ratio of ethylene glycol in the diol component is 80% by mass or more.

Among polyester resins that are obtained as described above by using the dicarboxylic acid component and the diol component, as the polyester resin in the present invention, polyethylene terephthalate (PET), polyethylene-2,6-naphthalate (PEN), and polybutylene terephthalate (PBT) are preferable. PET, which is advantageous in cost performance, is more preferable.

Titanium Compound

The titanium compound in the present invention serves as a polymerization catalyst in the production of the polyester resin composition.

The titanium compound particularly preferable in the present invention may be an organic chelate titanium complex having an organic acid as a ligand. Examples of an organic acid that is incorporated as a ligand in the organic chelate titanium complex may include: citric acid; lactic acid; trimellitic acid; and malic acid. Of these, an organic chelate complex having citric acid or a citric acid salt as a ligand is more preferable.

For instance, when an organic chelate titanium complex having citric acid as a ligand is used, as compared with other titanium compounds, a polyester resin having more adequate polymerization activity and color tone is obtained while less amount of foreign substances such as fine particles are generated. Even in the case of using a citric acid chelate titanium complex, by adding it in an esterification reaction step, a polyester resin having more adequate polymerization activity and color tone and smaller amount of terminal carboxy groups may be obtained, as compared with a case where it is added after the esterification reaction. About this point, it may be speculated that the titanium catalyst exhibits a catalytic effect also on the esterification reaction, so that a low acid value of the oligomer at the time when esterification reaction is finished may be obtained by adding the catalyst in the esterification reaction step, and the subsequent transesterification reaction proceeds more effectively; and that the complex with a ligand of citric acid is higher in hydrolysis resistance as compared with a titanium alkoxide or the like, shows no hydrolysis in the course of the esterification reaction, and functions effectively as a catalyst for the transesterification reaction while the original activity thereof is preserved.

Furthermore, it is generally known that hydrolysis resistance of polyester resins becomes worse as the amount of terminal carboxy groups increases. By using the titanium compound as described above, the amount of terminal carboxy groups decreases, whereby the hydrolysis resistance is expected to be improved.

As the citric acid chelate titanium complex, for instance, "VERTEC AC-420" (trade name) manufactured by Johnson Matthey Corp. and other commercial products are easily available.

The titanium compound in the present invention may be the other titanium compounds described below. The other titanium compounds may be included solely or may be used in combination with the organic chelate titanium complex. Preferably, the other titanium compounds are used in combination with the organic chelate titanium complex.

Examples of the other titanium compounds include: oxides; hydroxides; alkoxides; carboxylates; carbonates; oxalates; and halides.

Examples of the other titanium compounds include: a titanium alkoxide such as tetra-n-propyl titanate, tetra-i-propyl titanate, tetra-n-butyl titanate, tetra-n-butyl titanate tetramer, tetra-t-butyl titanate, tetracyclohexyl titanate, tetraphenyl titanate, or tetrabenzyl titanate; a titanium oxide obtained by hydrolysis of titanium alkoxide; a titanium-silicon or zirconium composite oxide that is obtained by hydrolysis of a mixture of a titanium alkoxide and a silicon or zirconium alkoxide; titanium acetate; titanium oxalate; potassium titanium oxalate; sodium titanium oxalate; potassium titanate; sodium titanate; a mixture of titanic acid and aluminum hydroxide; titanium chloride; a mixture of titanium chloride and aluminum chloride; and titanium acetylacetonate.

The titanium compound may be used singly or in a combination of two or more kinds thereof.

Phosphorus Compound

As the phosphorus compound in the present invention, at least one kind of pentavalent phosphoric acid ester having no aromatic ring as a substituent group is preferable. Examples of the pentavalent phosphoric acid ester include: trimethyl phosphate; triethyl phosphate; tri-n-butyl phosphate; trioctyl phosphate; tris(triethylene glycol) phosphate; methyl acid phosphate; ethyl acid phosphate; isopropyl acid phosphate; butyl acid phosphate; monobutyl phosphate; dibutyl phosphate; dioctyl phosphate; and triethyleneglycol acid phosphate.

Among the pentavalent phosphoric acid esters, a phosphoric acid ester (a compound represented by the following formula (3)) having a lower alkyl group having 3 or less carbon atoms as a substituent group is preferable. Specifically, trimethyl phosphate and triethyl phosphate are particularly preferable.

$$(RO)_3P=O \quad (3)$$

wherein R represents an alkyl group having from 1 to 3 carbon atoms.

Particularly, when a chelate titanium complex coordinated with citric acid or the salt thereof is used as the titanium compound for the catalyst, the pentavalent phosphoric acid ester is more advantageous in polymerization activity and color tone than a trivalent phosphoric acid ester. Furthermore, in an embodiment where a pentavalent phosphoric acid ester having a substituent group having 2 or less carbon atoms is added, balance between polymerization activity, color tone and heat resistance may be especially improved.

The polyester resin composition of the present invention preferably satisfies the following formula (4) and formula (5).

$$1 \text{ ppm} < \text{titanium element mass content} \leq 30 \text{ ppm} \quad (4)$$

$$50 \text{ ppm} < \text{phosphorus element mass content} \leq 90 \text{ ppm} \quad (5)$$

The respective contents of the titanium element and the phosphorus element in the polyester resin composition may be obtained by quantitatively analyzing the amounts of titanium element and phosphorus element with a high resolution inductively coupled plasma mass spectrometer (HR-ICP-MS: "ATTOM" (trade name), manufactured by SII NanoTechnology Inc.), and calculating the respective contents (ppm) from the results obtained.

The titanium content is more preferably from 3 ppm to 20 ppm, still more preferably from 5 ppm to 15 ppm, and particularly preferably from 5 ppm to 10 ppm.

The phosphorus content is more preferably from 60 ppm to 80 ppm and still more preferably from 65 ppm to 75 ppm.

When formulas (4) and (5) are satisfied in the polyester resin composition, balance between polymerization activity and hydrolysis resistance may be improved.

The phosphorus compound may be used singly or in a combination of two or more kinds thereof.

Specific Metal Compound

From the viewpoint of providing high static electricity applicability, the polyester resin composition of the present invention preferably includes a compound (hereinafter, also referred to as "specific metal compound" appropriately) that includes at least one kind of metal selected from the group consisting of an alkali metal (for instance, sodium, potassium or the like), an alkaline earth metal (for instance, magnesium or the like), an iron-group metal, manganese, tin, lead, and zinc, in an amount of metal of 50 ppm or more by mass.

The amount is preferably from 50 ppm to 100 ppm, more preferably from 60 ppm to 90 ppm, and still more preferably from 70 ppm to 80 ppm.

The specific metal compound may be used singly or in a combination of two or more kinds thereof.

Note that, the content of the metal of the specific metal compound in the polyester resin composition may be obtained by quantitatively measuring the amount of each metal element with a high resolution inductively coupled plasma mass spectrometer (HR-ICP-MS: "ATTOM" (trade name), manufactured by SII NanoTechnology Inc.), and calculating the content (ppm) from the results obtained.

Among the specific metal compounds, from the viewpoint of providing static electricity applicability, a magnesium compound is preferable. Incorporation of the magnesium compound prevents effectively the polyester resin composition from being colored, whereby the polyester resin composition is provided with excellent color tone and heat resistance.

Examples of the magnesium compound include magnesium oxide, magnesium hydroxide, a magnesium alkoxide, and a magnesium salt such as magnesium acetate or magnesium carbonate. Of these, from the viewpoint of solubility in diols such as ethylene glycol, magnesium acetate is most preferable.

The amount of terminal COOH groups in the polyester resin composition of the present invention (and also in a polyester film that is obtained from the composition) is preferably 25 eq/t or less, more preferably from 1 eq/t to 20 eq/t, still more preferably from 3 eq/t to 15 eq/t, and particularly preferably from 5 eq/t to 10 eq/t.

Here, the "amount of terminal COOH groups" denotes an amount of carboxy groups (—COOH) that is contained in a polyester resin at an end of the molecular structure thereof.

When the amount of terminal COOH groups contained in the polyester resin composition is in the above range, film adaptabilities to extrusion, stretching, and coating may be imparted while hydrolysis resistance is improved. In addition, an adequate adhesion to the other films may be provided.

The amount of terminal COOH groups mentioned herein is a value that is measured by titration in accordance with the method described in H. A. Pohl, Anal. Chem. 26 (1954) p. 2145.

The polyester resin composition of the present invention (and also a polyester film obtained from the composition) has a common logarithm of R (Log R) of preferably 6.9 or less, more preferably 6.7 or less, and still more preferably 6.5 or less, wherein R represents a volume resistivity ($\Omega \cdot m$) of the polyester resin composition.

When Log R is 6.9 or less, electrostatic voltage application is easily achieved in a process of forming a film from the polyester resin composition of the present invention, whereby unevenness in film thickness may be reduced. In addition, the resulting film advantageously exhibits high electrical strength when it is used as a solar cell protective film or the like.

The volume resistivity (R) mentioned herein is measured by the following method.

Method of Measuring Volume Resistivity R

A polyester resin composition that has been obtained through esterification reaction and transesterification reaction (condensation polymerization) using a dicarboxylic acid and a diol is molded into pellets (having a cross-section with a long axis of about 4 mm and a short axis of about 2 mm, and a length of about 3 mm). After the pellets are dried in a vacuum drier so as to be crystallized, 15 g of the pellets were weighed, put into a test tube, and melted in an oil bath at 290° C. Measuring electrodes are inserted therein so as to read out a volume resistivity value with a digital multi meter (manufactured by IWATSU TEST INSTRUMENTS CORPORATION).

The polyester resin composition of the present invention may further include additives such as a light stabilizer or an antioxidant.

The polyester resin composition of the present invention preferably includes a light stabilizer added therein. Degradation caused by UV light may be prevented by including the light stabilizer. The light stabilizer may be a compound that absorbs light such as UV light and converts it into heat energy or a material that scavenges radicals generated by photodecomposition of the polyester resin composition and prevents decomposition chain reactions.

The light stabilizer is preferably a compound that absorbs light such as UV light and converts it into heat energy. Incorporation of such light stabilizer in the composition allows a film that is composed of the polyester resin composition to keep an effect of improving partial discharge voltage over a long time at high level even if the film receives UV light irradiation constantly over a long time. Further, the incorporation prevents the film from having color tone change or strength degradation caused by UV light.

As an UV light absorber, for instance, an organic UV light absorber, an inorganic UV light absorber, or a combination thereof may be used. These may be used preferably without any limitation as long as the other properties of the polyester resin are not impaired. On the other hand, the UV light absorber desirably has an excellent heat resistance and is dispersible uniformly in the polyester resin composition.

Examples of the UV light absorber, as the organic UV light absorber, include: an UV light absorber such as salicylic acid compound, benzophenone compound, benzotriazole compound, cyanoacrylate compound, or the like; and an UV light stabilizer such as hindered amine compound. Specific examples thereof include: p-t-butylphenyl salicylate and p-octylphenyl salicylate, which are salicylic acid compounds; 2,4-dihydroxy benzophenone, 2-hydroxy-4-methoxy benzophenone, 2-hydroxy-4-methoxy-5-sulfo benzophenone, 2,2',4,4'-tetrahydroxy benzophenone, and bis(2-methoxy-4-hydroxy-5-benzoylphenyl) methane, which are benzophenone compounds; 2-(2'-hydroxy-5'-methylphenyl)benzotriazole, 2-(2'-hydroxy-5'-methylphenyl)benzotriazole, and 2,2'-methylene bis[4-(1,1,3,3-tetramethylbutyl)-6-(2H-benzotriazole-2-yl)phenol], which are benzotriazole compounds; ethyl-2-cyano-3,3'-diphenyl acrylate), which is cyano acrylate compound; 2-(4,6-diphenyl-1,3,5-triadizine-2-yl)-5-[(hexyl)oxy]-phenol, which is triazine compound; bis (2,2,6,6-tetramethyl-4-piperidyl)sebacate and dimethyl saccinate.1-(2-hydroxyethyl)-4-hydroxy-2,2,6,6-tetramethyl piperidine polycondensate, which are hindered amine compounds; nickel bis(octylphenyl) sulfide; and 2,4-di.t-butylphenyl-3',5'-di.t-butyl-4'-hydroxy benzoate.

Among these UV light absorbers, from the viewpoint of having a higher resistance against repeated UV light absorption, the triazine based UV light absorber is more preferable. Note that, these UV light absorbers may be introduced into a polyester resin composition directly or in a mode where a monomer having a capability of absorbing UV light is copolymerized with an organic conductive material or a water non-soluble resin.

The content of the light stabilizer in the polyester resin composition is preferably from 0.1% by mass to 10% by mass with respect to the total mass of the polyester resin composition, more preferably from 0.3% by mass to 7% by mass, and still more preferably from 0.7% by mass to 4% by mass. As a result, the molecular weight of polyester resin may be prevented from being lowered by photo-degradation over a long time.

It is desirable that the polyester resin composition of the present invention described above is produced by a method of producing the polyester resin composition of the present invention that will be described below.

The method of producing the polyester resin composition of the present invention includes:

a step (A) of reacting a dicarboxylic acid component and a diol component through an esterification reaction to obtain an esterification reaction product;

a step (B) of performing a transesterification reaction of the esterification reaction product to obtain a condensation polymerization product; and adding a phosphorus compound to a reaction liquid, before the esterification reaction in step (A) is terminated but after a titanium compound is added to the reaction liquid, so as to satisfy the above formula (1) and formula (2), thereby obtaining the polyester resin composition.

Hereinafter, step (A) and step (B) may be collectively referred to as a melt polymerization step.

Step (A) (Esterification Step)

In step (A), a dicarboxylic acid component and a diol component are reacted through esterification reaction to obtain an esterification reaction product.

As the dicarboxylic acid component and the diol component used in step (A), the above mentioned dicarboxylic acid component and diol component are used.

The esterification of the dicarboxylic acid component and the diol component in step (A) is carried out by reacting the dicarboxylic acid component and the diol component in the present of a catalyst that includes a titanium compound.

In step (A), the dicarboxylic acid component and the diol component are mixed with the titanium compound at first before the phosphorous compound and the optional magnesium compound are added. The titanium compound such as an organic chelate titanium complex has a high catalytic activity also for esterification reaction, so that esterification reaction may proceed properly.

Examples of a mode of adding the titanium compound in step (A) include: a mode in which the dicarboxylic acid component, the diol component, and the titanium compound are mixed at the same time; and a mode in which a mixture of the dicarboxylic acid component and the diol component is preliminary prepared, and then the titanium compound is added to the mixture. Mixing method is not particularly limited, but may be performed in a conventional manner.

The used amount of the diol component (for instance, ethylene glycol) is in a range of preferably from 1.015 moles to 1.50 moles with respect to 1 mole of the dicarboxylic acid component (for instance, terephthalic acid) and the ester derivative thereof optionally used, more preferably from 1.02 moles to 1.30 moles, and still more preferably from 1.025 moles to 1.10 moles. When the used amount is 1.015 moles or more, the esterification reaction may proceed properly. When 1.50 moles or less, for instance, generation of by-product (diethylene glycol) through dimerization of ethylene glycol is suppressed, whereby many properties including melting point, glass transition temperature, crystallinity, heat resistance, hydrolysis resistance, and weather resistance may be kept properly.

The dicarboxylic acid component and the diol component may be introduced by preparing slurry that contains these components and supplying it continuously in step (A).

In step (A), the phosphorus compound is required to be added to the reaction liquid in a manner that formula (1) and formula (2) are satisfied, before the esterification reaction is terminated but after the titanium compound is added.

Here, "before the esterification reaction is terminated" means "before step (B) starts by depressurizing a reactor tank." When the phosphorus compound is added under a reduced pressure, undesirably the phosphorus compound is not mixed with the reaction liquid and is scattered away outside of the reaction system.

The phosphorus compound is added, in practice, under a pressure of preferably more than $13.3 \times 10^{-3}$ MPa, more preferably $66.5 \times 10^{-2}$ MPa or higher, and particularly preferably $1.01 \times 10^{-1}$ MPa (atmospheric pressure) or higher.

As the phosphorus compound used in step (A), the aforementioned phosphorus compounds may be used. As a mode of adding the phosphorous compound, a mode of adding the phosphorus compound directly to the reaction liquid may be selected. However, considering: (1) the fact that the titanium compound (catalyst) loses the catalytic activity thereof effectively by an action of a reaction product between the phosphorus compound and the diol component such as ethylene glycol; (2) uniformly dispersing the phosphorous compound in polyester raw materials; and (3) capability of suppressing fluctuation in phosphorus compound concentration during continuous production, a mode of preparing an addition solution that is obtained by dissolving the phosphorus compound at about 25° C. (normal temperature) in a solution containing the diol component and adding the addition solution to the reaction liquid is preferable.

The content of the phosphorus compound in the addition solution is, from the viewpoint of the aforementioned inactivation of the catalytic activity of the titanium compound and dispersability, preferably from 1% by mass to 10% by mass with respect to the total mass of the solution, more preferably from 1% by mass to 7.5% by mass, and still more preferably from 1.5% by mass to 5% by mass.

The temperature of the solution in which the phosphorus compound is dissolved is preferably from 0° C. to 60° C. and particularly preferably 25° C. (normal temperature), from the viewpoint of allowing a mixed liquid of the phosphorus compound and the diol component such as ethylene glycol to be dispersed uniformly in the raw materials and keeping the temperature of the reactor tank.

In step (A), when a specific metal compound is added, the specific metal compound is added to the reaction liquid before the phosphorus compound is added.

Although the specific metal compound may be added to the reaction liquid before the phosphorous compound is added, however, from the viewpoint of suppressing foreign substances derived from the specific metal compound, preferably, the specific metal compound may be added after the titanium compound is added but before the phosphorus compound is added.

In step (A), particularly preferably, the titanium compound serving as the catalyst, the phosphorus compound serving as the additive, and the magnesium compound serving as the specific metal compound are added and reacted in a manner that the value Z calculated from the following formula (i) satisfies the following formula (ii).

Here, "P content" represents the amount of phosphorus derived from the whole phosphorus compound; and "Ti content" represents the amount of titanium derived from the whole titanium compound.

In this way, in a catalyst system including the titanium compound, a combination use of the phosphorus compound and the magnesium compound is selected, and the addition timing and ratio thereof are regulated. Thereby, while keeping appropriately high catalytic activity of the titanium compound, less yellowish color tone may be obtained, and heat resistance may be imparted so that yellow coloring is not easily developed even by exposure to high temperature during a polymerization reaction or a subsequent film forming (melting) process.

$$Z=5\times(\text{P content[ppm]/P atomic weight})-2\times(\text{Mg content[ppm]/Mg atomic weight})-4\times(\text{Ti content[ppm]/Ti atomic weight}) \quad \text{(i)}$$

$$0 \leq Z \leq +5.0 \quad \text{(ii)}$$

Formulas (i) and (ii) work as an index expressing quantitatively a balance among these three components, because the phosphorus compound interacts not only with the titanium compound but also with the magnesium compound.

Formula (i) expresses the amount of phosphorus capable of acting on titanium, wherein the amount is given by subtracting the amount of phosphorus acting on magnesium from the total amount of phosphorus capable of reacting. When the value Z is positive, the situation is that the amount of phosphorus for inhibiting titanium is in excess. To the contrary, when the value Z is negative, the situation is that the amount of phosphorus for inhibiting titanium is insufficient. Since respective atoms of Ti, Mg, and P are not equivalent in reaction, respective mole numbers are weighted by multiplying respective valences in the formula.

In the present invention, the titanium compound, the phosphorus compound, and the magnesium compound that do not require special synthesis or the like and are low cost and easily available are used, whereby a polyester resin excellent in color tone and resistance against thermal coloration may be obtained while reactivity required for the reaction is secured.

In the above formula (ii), from the viewpoint of further improving color tone and resistance against thermal coloration while maintaining the polymerization reactivity, a case satisfying +1.5≤Z≤+5.0 is preferable, a case satisfying +1.5≤Z≤+4.0 is more preferable and a case satisfying +1.5≤Z≤+3.0 is further more preferable.

In a preferred embodiment of step (A), an aromatic dicarboxylic acid is used as the dicarboxylic acid component and an aliphatic diol is used as the diol component; a chelate titanium complex having citric acid or citric acid salt as a ligand thereof is added as the titanium compound in an amount of titanium element of from 1 ppm to 30 ppm; after that, in the presence of the chelate titanium complex, a magnesium salt of a weak acid is added in an amount of magnesium element of from 60 ppm to 90 ppm (preferably from 70 ppm to 80 ppm); and then a pentavalent phosphoric acid ester having no aromatic ring as a substituent group is further added in an amount of phosphorus element of from 60 ppm to 80 ppm (preferably from 65 ppm to 75 ppm).

Step (A) may be carried out by using a multi-stage apparatus in which at least two reactors are connected in series, under a condition of refluxing ethylene glycol, while water or alcohol produced by the reaction is removed out of the reaction system.

Step (A) may be carried out in a single stage or may be divided into two or more stages. When step (A) is carried out in a single stage, the reaction temperature is preferably from 230° C. to 260° C. and more preferably from 240° C. to 250° C. The pressure is preferably from 1.0 kg/cm$^2$ to 5.0 kg/cm$^2$ (from 0.1 MPa to 0.5 MPa) and more preferably from 2.0 kg/cm$^2$ to 5.0 kg/cm$^2$ (from 0.2 MPa to 0.5 MPa).

When step (A) is carried out in two or more stages, for instance, in two stages, the reaction temperature of a first reactor tank is preferably from 230° C. to 260° C. and more preferably from 240° C. to 250° C., and the pressure is preferably from 1.0 kg/cm$^2$ to 5.0 kg/cm$^2$ (from 0.1 MPa to 0.5 MPa) and more preferably from 2.0 kg/cm$^2$ to 3.0 kg/cm$^2$ (from 0.2 MPa to 0.3 MPa). The reaction temperature of a second reactor tank is preferably from 230° C. to 260° C. and more preferably from 245° C. to 255° C., and the pressure is preferably from 0.5 kg/cm$^2$ to 5.0 kg/cm$^2$ (from 0.05 MPa to 0.5 MPa) and more preferably from 1.0 kg/cm$^2$ to 3.0 kg/cm$^2$ (from 0.1 MPa to 0.3 MPa). Furthermore, when carried out in three stages, the reaction conditions of the middle stage are selected to be preferably intermediates between the first reactor tank and a final reactor tank.

In this way, in the method of producing the polyester resin composition of the present invention, after the titanium compound is added to the reaction liquid, the specific metal compound that is an optional component and the phosphorus compound are added; and the content ratio of titanium element derived from the added titanium compound to phosphorus element derived from the added phosphorus compound satisfies the above formula (1). As a result, while catalytic activity required for the polymerization of polyester resin is secured by the titanium compound, the catalytic activity of the titanium compound may be inactivated sufficiently at the time when the polymerization is terminated, so that the resulting polyester resin composition exhibits an excellent hydrolysis resistance.

In addition, in the present invention, in step (A), even when all of the titanium compound, the phosphorus compound, and the specific metal compound that is an optional component are added to the reaction liquid, a desired advantage may be obtained, and thus productivity of the polyester resin composition is also improved.

To the contrary, when the phosphorus compound is added to the reaction liquid before addition of the titanium compound, catalytic activity required during polymerization and sufficient inactivation of the catalyst at the end of the polymerization are both not attained. For instance, in the case of adding the phosphorus compound, the specific metal compound, and the titanium compound in this order to the reaction liquid, the phosphorus compound inactivates the catalytic activity of the specific metal compound before the phosphorus compound acts on the titanium compound, so that inactivation of the titanium compound at the time when the polymerization is terminated becomes insufficient. Further, in the case of adding the phosphorus compound, the titanium compound, and the specific metal compound in this order to the reaction liquid, the phosphorus compound inactivates the titanium compound excessively, so that polymerization speed becomes low and productivity lowers.

Paragraph [0021] of JP-A No. 2007-204538 describes that the addition of a phosphorous compound during the polymerization step leads to a problem in that the polymerization rate is decreased so that productivity is lowered, the polymerization time is increased so that the product becomes more yellowish, or the amount of terminal carboxyl groups is increased. That is, in conventional art, the addition of a phosphorous compound during the polymerization step in which a titanium compound is used to produce a polyester resin cannot be achieved. However, in the present invention, when the titanium compound and the phosphorous compound are added, an appropriate amount of the phosphorous compound is added at specific timing, whereby problems that cannot be solved in the conventional art can be solved. In particular, in the present invention, a large amount of a phosphorous compound may be used as compared with the case of conventional art, as shown in formula (1). In contrast, in conventional art, the addition of such a large amount of a phosphorous compound in the polymerization step has not been achieved.

Step (B) (Transesterification Reaction Step)

In step (B), the esterification reaction product obtained in step (A) is subjected to transesterification reaction to obtain a condensation polymerization product.

Step (B) may be carried out in a single stage or may be divided into two or more stages.

The esterification reaction product such as an oligomer that is formed in step (A) is successively subjected to transesterification reaction. This reaction may be performed preferably by supplying the product to a multi-stage reactor tank.

Reaction temperature and retention time of the product in a reactor tank in step (B) influence the concentration of terminal COOH groups in the condensation polymerization product obtained in step (B). Specifically, as the reaction temperature is lowered, the concentration of terminal COOH groups is more decreased, so that the polyester resin composition and the film obtained from the composition exhibit still higher hydrolysis resistance. On the other hand, as the reaction temperature in step (B) is lowered, the transesterification reaction proceeds slower, so that retention time of the product in the reactor is required to be extended. In this case, productivity of the polyester resin composition tends to be lowered.

Therefore, for instance, when step (B) is performed in a single stage reactor and greater emphasis is placed on further improvement of hydrolysis resistance of the polyester resin composition and the film obtained from the composition, the reaction temperature is preferably from 255° C. to 280° C. and more preferably from 260° C. to 275° C.; the retention time is preferably from 1 hour to 4 hours and more preferably from 1.5 hours to 2.5 hours; and the pressure is preferably from 10 Torr to 0.01 Torr (from $1.33 \times 10^{-3}$ MPa to $1.33 \times 10^{-6}$ MPa) and more preferably from 5 Torr to 0.1 Torr (from $6.67 \times 10$ MPa to $1.33 \times 10^{-6}$ MPa).

For instance, when step (B) is performed in a single-stage reactor tank and greater emphasis is placed on further improvement of productivity, the reaction temperature is preferably from 270° C. to 290° C. and more preferably from 275° C. to 285° C.; the retention time is preferably from 1 hour to 3 hours and more preferably from 1 hour to 1.5 hours; and the pressure is preferably from 10 Torr to 0.1 Torr (from $1.33 \times 10^{-3}$ MPa to $1.33 \times 10^{-5}$ MPa) and more preferably from 5 Torr to 0.5 Torr (from $6.67 \times 10$ MPa to $6.67 \times 10^{-5}$ MPa).

For instance, when step (B) is performed in a three-stage reactor tank and greater emphasis is placed on further improvement of the productivity of the polyester resin composition, in a preferred embodiment, in a first reactor tank, the reaction temperature is preferably from 255° C. to 280° C. and more preferably from 260° C. to 275° C. and the pressure is preferably from 100 Torr to 10 Torr (from $13.3 \times 10^{-3}$ MPa to $1.3 \times 10^{-3}$ MPa) and more preferably from 50 Torr to 20 Torr (from $6.67 \times 10^{-3}$ MPa to $2.67 \times 10^{-3}$ MPa); in a second reactor tank, the reaction temperature is preferably from 265° C. to 285° C. and more preferably from 270° C. to 280° C. and the pressure is preferably from 20 Torr to 1 Torr (from $2.67 \times 10^{-3}$ MPa to $1.33 \times 10^{-4}$ MPa) and more preferably from 10 Torr to 3 Torr (from $1.33 \times 10^{-3}$ MPa to $4.0 \times 10^{-4}$ MPa); and in a third reactor tank which is a final reactor tank, the reaction temperature is preferably from 270° C. to 290° C. and more preferably from 275° C. to 285° C. and the pressure is preferably from 10 Torr to 0.1 Torr (from $1.33 \times 10^{-3}$ MPa to $1.33 \times 10^{-5}$ MPa) and more preferably from 5 Torr to 0.5 Torr (from $6.67 \times 10^{-4}$ MPa to $6.67 \times 10^{-5}$ MPa). The retention times of respective products in the first to third reactor tanks are each preferably from 0.3 hour to 1 hour. The total retention time is preferably from 1 hour to 2 hours.

On the other hand, when greater emphasis is placed on further improvement of hydrolysis resistance of the polyester resin composition and the film obtained from the composition, the reaction temperature in the third reactor tank is changed to preferably from 260° C. to 280° C. and more preferably from 260° C. to 270° C.; and the retention times of respective products in the first to third reactor tanks are each preferably from 0.5 hour to 2 hours and the total retention time is preferably from 1.5 hours to 2.5 hours.

The condensation polymerization product obtained in step (B) may be formed into small pieces such as pellets.

The production method of the present invention includes step (A) and step (B), and the titanium compound, the phosphorus compound, and the magnesium compound as the specific metal compound are used, so that a polyester resin composition that includes titanium atom (Ti), magnesium atom (Mg), and phosphorus atom (P) wherein the value Z calculated from the following formula (i) satisfies the following formula (ii) may be obtained.

$$Z=5\times(\text{P content[ppm]/P atomic weight})-2\times(\text{Mg content[ppm]/Mg atomic weight})-4\times(\text{Ti content[ppm]/Ti atomic weight}) \quad \text{(i)}$$

$$0 \leq Z \leq +5.0 \quad \text{(ii)}$$

Such a polyester resin composition satisfies $0 \leq Z \leq +5.0$, so that three elements of Ti, P, and Mg are balanced properly. Thereby excellent color tone and heat resistance (yellow coloring at high temperature is reduced) may be attained and high static electricity applicability may be kept while polymerization reactivity is preserved. Further in the present invention, a less yellowish polyester resin having a high transparency may be provided without using a color tone adjusting material such as a cobalt compound or a colorant.

Formula (i), as described above, expresses quantitatively the balance among the three of the phosphorus compound, the magnesium compound, and the titanium compound. Namely, the amount of phosphorus acting on titanium is expressed by subtracting the amount of phosphorus acting on magnesium from the total amount of phosphorus capable of reacting. When the value Z is less than 0 (zero), that is, the amount of phosphorus acting on titanium is too small, catalytic activity (polymerization reactivity) of titanium is enhanced, but heat resistance and color tone degrade; the resulting polyester resin has yellowish color and is also colored in a film production process (melting process) after polymerization, for instance. When the value Z exceeds +5.0, that is, the amount of phosphorus acting on titanium is too large, the resulting polyester has adequate heat resistance and color tone, but catalytic activity lowers too much. This results in poor productivity.

In the present invention, for reasons similar to the above, formula (ii) satisfies preferably $1.5 \leq Z \leq 5.0$, more preferably $1.5 \leq Z \leq 4.0$ and still more preferably $1.5 \leq Z \leq 3.0$.

Measurement for respective elements of Ti, Mg, and P may be performed as follows. Respective elements in the polyester resin composition are quantitatively analyzed with a high resolution inductively coupled plasma mass spectrometer (HR-ICP-MS: "ATTOM" (trade name), manufactured by SII NanoTechnology Inc.); and the respective contents (ppm) are calculated from the results obtained.

The polyester resin composition obtained by the production method of the present invention further preferably satisfies the following formula (iii).

$$\text{"b" value of pellets formed after condensation polymerization} \leq 4.0 \quad \text{(iii)}$$

When a polyester resin obtained by condensation polymerization is pelletized and the "b" value of the resulting pellets is 4.0 or less, the polyester resin is less yellowish and excellent in transparency. When the "b" value is 3.0 or less, the polyester resin exhibits a color tone comparable to a polyester resin polymerized with a Ge catalyst.

The "b" value serves as an index representing color tone, which is measured with an SM color meter (manufactured by Suga Test Instruments Co., Ltd.).

Furthermore, the polyester resin composition obtained preferably satisfies the following formula (iv).

$$\text{color tone change rate}[\Delta b/\text{minute}] \leq 0.15 \quad \text{(iv)}$$

In the case where the color tone change rate [$\Delta b$/minute] when keeping at 300° C. a melt of pellets of polyester resin obtained through condensation polymerization is 0.15 or less, yellow coloring caused by exposure to heat may be kept low.

As a result, a less yellow-colored film having excellent color tone may be attained, for instance, when a film is produced by extrusion with an extruder.

The smaller the value of the color tone change rate is, the better. Particularly preferably, the value is 0.10 or less.

The color tone change rate serves as an index representing color change by heat, and the value thereof may be obtained by the following method. Namely, pellets of polyester resin composition are fed into a hopper of an injection molding machine (for instance, "EC100NII" (trade name) manufactured by Toshiba Machine Co., Ltd.); they are melted and kept in a cylinder (300° C.); the melt of the pellets is molded into a plate form while changing the keeping time; the "b" value of the resulting plate is measured with an SM color meter (manufactured by Suga Test Instruments Co., Ltd.). The change rate [Δb/minute] is calculated based on the change of the "b" value.

Step (C) (Solid-State Polymerization Step)

The production method of the present invention includes preferably step (C) in which the condensation polymerization product obtained through step (A) and step (B) (melt polymerization step) is further subjected to solid-state polymerization.

By the solid-state polymerization, reduction of terminal COOH amount, reduction of cyclic trimers, and increase of polymerization degree (intrinsic viscosity) may be attained.

The solid-state polymerization may be performed in a continuous process (resin is put in a heated cylinder; the resin is passed through the cylinder while the resin is heated and retained for a given time therein; and then the resin is successively discharged) or in a batch process (resin is put in a vessel; and the resin is stirred for a given time while the resin is heated).

The temperature of solid-state polymerization is preferably from 170° C. to 240° C., more preferably from 180° C. to 230° C., and still more preferably from 180° C. to 220° C. When the temperature is within the above ranges, decomposition reaction may be suppressed and terminal COOH groups may be reduced effectively. This is preferable from the viewpoint of securing hydrolysis resistance.

The time of solid-state polymerization is preferably from 5 hours to 100 hours, more preferably from 10 hours to 75 hours, and still more preferably from 15 hours to 50 hours. The time within the above ranges is preferable, because terminal COOH groups may be sufficiently reduced while productivity is secured.

The pressure at which solid-state polymerization is performed is preferably from 1 Pa to 1,000 Pa, more preferably from 1 Pa to 500 Pa, and still more preferably from 5 Pa to 500 Pa. When the pressure at which solid-state polymerization is performed is within the above ranges, maintenance frequency of a vacuum pump may be reduced. This is preferable from the viewpoint of attaining excellent continuous productivity Solid-state polymerization is performed preferably in vacuum or in a nitrogen atmosphere. From the viewpoint of suppressing fluctuation of pellet properties (IV, terminal COOH amount, crystallization degree, and color tone), more preferably solid-state polymerization is performed in a nitrogen atmosphere.

Note that, solid-state polymerization may be performed with reference to the methods described in Japanese Patent Nos. 2621563, 3121876, 3136774, 3603585, 3616522, 3617340, 3680523, 3717392 and 4167159, and others, for instance.

The polyester resin composition of the present invention that is produced preferably by the above production method is excellent in hydrolysis resistance, so that the composition may be formed into various shapes including film, sheet, plate, and fiber and used preferably in various applications where hydrolysis resistance is requested.

The polyester resin composition of the present invention is particularly preferably used for a polyester film or a polyester sheet of outdoor use where weather resistance is requested. Examples of the polyester film or polyester sheet of outdoor use include a backsheet in a solar cell power generation module, a lighting film, and an agriculture sheet. The backsheet in a solar cell power generation module is particularly preferable.

Polyester Film and Method of Producing the Same

Hereinafter, a polyester film (polyester film of the present invention) that is one of preferred application embodiments of the polyester resin composition of the present invention and a method of producing the polyester film will be described.

The polyester film of the present invention includes the aforementioned polyester resin composition of the present invention, and has a thickness of from 250 μm to 500 μm. Note that, the thickness of the polyester film of the present invention is a thickness after stretching is completed.

With respect to a polyester film, the hydrolysis resistance thereof generally degrades as the thickness thereof increases. For instance, the polyester film is likely not to resist against long time use under a hard environment such as direct exposure to wind and rain or sunlight.

On the other hand, the polyester film to which the polyester resin composition of the present invention is applied exhibits an excellent hydrolysis resistance, so that degradation in long time use is suppressed even with a relatively thick film thickness of from 250 μm to 500 μm.

As a result, with respect to the polyester film of the present invention, for instance, when it is used to configure a solar cell power generation module, a desired power generation performance may be attained stably over a long time.

When the polyester film of the present invention is stored under an atmospheric condition, the storage time (retention half-life of elongation at break) until the elongation at break after storage becomes 50% of the elongation at break before storage is preferably 4,000 hours or longer. The retention half-life of elongation at break is more preferably 4,500 hours or longer and still more preferably 5,000 hours or longer.

The elongation at break mentioned herein is a value that is obtained as follows. The polyester film is cut into a specimen (1 cm×20 cm in size); and the specimen is stretched with a distance of 5 cm between chucks and at a rate of 20%/minute.

The intrinsic viscosity (IV) of the polyester film is preferably from 0.6 to 0.9, more preferably from 0.63 to 0.85, and still more preferably from 0.65 to 0.8. When IV is 0.6 or more, the molecular weight of the polyester may be kept within a desired range and an adequate adhesion may be attained at bonding interface to another layer without cohesion failure, when the polyester film is incorporated in a multilayer configuration. When IV is 0.9 or less, an adequate melt viscosity may be attained during film production process; thermal decomposition of polyester caused by shearing heat generation may be suppressed; and acid value (AV value) may be suppressed low.

The method of producing a polyester film according to the present invention preferably includes a molding step of melt-kneading the polyester resin composition, after step (C) in the method of producing the polyester resin composition of the present invention, and extruding it from a nozzle, thereby forming a polyester film having a thickness of from 250 μm to 500 μm.

In the method of producing a polyester film according to the present invention, only the polyester resin composition of the present invention may be used, or the polyester resin composition of the present invention may be used in combination with the other polyester resin compositions (for instance, commercially available polyester resin compositions).

Molding Step

In the molding step, the polyester resin composition after step (C) is melt-kneaded and extruded from a nozzle (extrusion die) so as to form a polyester film. In this step, a polyester film having a thickness of from 250 μm to 500 μm is obtained.

The molding step, more specifically, includes: a melt-kneading and extruding stage in which the polyester resin composition after step (C) is melt-kneaded and extruded from a nozzle; a cooling and solidifying stage in which an unstretched polyester film is cooled and solidified; and a stretching stage in which the unstretched film after cooled and solidified is stretched.

Melt-Kneading and Extruding Stage

Melting may be performed with an extruding machine after the polyester resin composition after step (C) is dried so as to reduce remaining water content to 100 ppm or less.

The melting temperature is preferably from 250° C. to 320° C., more preferably from 260° C. to 310° C., and still more preferably from 270° C. to 300° C. The extruding machine may be a uniaxial or a multi-axial. From the viewpoint of more suppressing generation of terminal COOH groups caused by thermal decomposition, more preferably, the inside of the extruding machine is replaced with nitrogen.

Melted resin (melt) is extruded from an extrusion die through a gear pump, a filter, and the like. On this occasion, the melt may be extruded in a single layer or multi layers.

Cooling and Solidifying Stage

The melt extruded from the extrusion die may be solidified with a chilled roll (cooling roll). The temperature of the chilled roll is preferably from 10° C. to 80° C., more preferably from 15° C. to 70° C., and still more preferably from 20° C. to 60° C. From the viewpoint of enhancing adhesion between the melt and the chilled roll and improving cooling efficiency, static electricity is preferably applied before the melt contacts the chilled roll. Further, it is desirable that cold wind is blown at the opposite side of the chilled roll or a cooling roll contacts it so as to promote cooling. As a result, even a thick film (specifically, a film having a thickness of 250 μm or more after stretched) may be effectively cooled.

Note that, when cooling is not enough, spherical crystals are likely to be generated, which result in uneven stretching, whereby thickness unevenness is sometimes brought about.

Stretching Stage

After the stage described above, a resulting extruded film (unstretched film) is biaxially stretched, so that a polyester film of the present invention may be preferably prepared.

Specifically, preferably, an unstretched polyester film is introduced into a group of rolls heated at a temperature from 70° C. to 140° C.; stretched in a longitudinal direction (length direction, that is, a running direction of the film) by a stretching ratio of from 3 times to 5 times; and then cooled with a group of rolls at a temperature from 20° C. to 50° C. After that, the film is introduced into a tenter while both ends thereof are held with clips, and stretched in a direction (width direction) perpendicular to the longitudinal direction by a stretching ratio of from 3 times to 5 times in an atmosphere heated at a temperature of from 80° C. to 150° C.

The stretching ratio is preferably from 3 times to 5 times in the longitudinal direction and width direction respectively. An area ratio (given by multiplying the longitudinal stretching ratio by the width stretching ratio) is preferably from 9 times to 15 times. When the area ratio is 9 times or more, the resulting biaxially stretched laminating film exhibits adequate reflectance, shielding property, and film strength. When the area ratio is 15 times or less, the film may be prevented from being broken when it is stretched.

As a biaxially stretching method, either one may be selected from a stepwise biaxially stretching method as described above in which stretching in a longitudinal direction and stretching in a width direction are performed separately and a simultaneous biaxially stretching method in which stretching in a longitudinal direction and stretching in a width direction are performed at the same time.

In order to complete crystal orientation of the resulting biaxially stretched film and to impart flatness and dimensional stability, it is preferable to subsequently perform a heat treatment for from 1 second to 30 seconds in the tenter, preferably at a temperature equal to or higher than the glass transition temperature (Tg) of the raw material resin but lower than the melting point (Tm) thereof, and then perform uniform and gradual cooling to room temperature. Generally, when the heat treatment temperature (Ts) is low, heat shrinkage of the film becomes large, and thus the heat treatment temperature is selected to be preferably high in order to impart high dimensional stability against heating. However, when the heat treatment temperature is selected to be too high, orientational crystallinity lowers, as a result, the resulting film sometimes exhibits poor hydrolysis resistance. Therefore, the heat treatment temperature (Ts) of the polyester film according to the present invention satisfies preferably 40° C.≤(Tm−Ts)≤90° C., more preferably 50° C.≤(Tm−Ts)≤80° C., and still more preferably 55° C.≤(Tm−Ts)≤75° C.

Furthermore, the polyester film of the present invention may be used as a backsheet that is a component of a solar cell power generation module. In this case, the atmospheric temperature may be elevated to about 100° C. when the module is used, and thus the heat treatment temperature (Ts) is preferably from 160° C. to Tm−40° C. (note that, Tm−40° C.>160° C.), more preferably from 170° C. to Tm−50° C. (note that, Tm−50° C.>170° C.), and still more preferably from 180° C. to Tm−55° C. (note that, Tm−55° C.>180° C.).

In addition, relaxation treatment of from 3% to 12% in the width or longitudinal direction may be performed, when needed.

Functional Layer

The polyester film of the present invention may be provided with at least one functional layer such as an easy adhesion layer, a UV absorption layer, or a white layer. For instance, on a polyester film after uniaxial and/or biaxial stretching, the following functional layer may be formed by coating. Known coating techniques such as roll coating, knife edge coating, gravure coating, or curtain coating may be used for the coating.

In addition, before coating, surface treatment (such as flame treatment, corona treatment, plasma treatment, or UV treatment) may be performed on the surface of the polyester film. Furthermore, lamination of these functional layers with an adhesive on the polyester film is also preferable.

Easy Adhesion Layer

The polyester film of the present invention, in a configuration of a solar cell module, preferably possesses an easy adhesion layer on the side thereof facing to a sealing material of a cell side substrate in which a solar cell device is sealed with the sealing material. By providing the easy adhesion layer, the backsheet and the sealing material may be firmly bonded. Specifically, the easy adhesion layer has an adhesion force of preferably 10 N/cm or more and more preferably 20

N/cm or more with respect to EVA (copolymer of ethylene and vinylacetate) that is used as the sealing material.

In addition to that, the easy adhesion layer desirably has a high wet and heat resistance, because the backsheet is required not to be peeled off during the use of the solar cell module.

(1) Binder

The easy adhesion layer may include therein at least one kind of binder.

Examples of the binder include: polyester; polyurethane; acrylic resin; and polyolefin. Among these, from the viewpoint of durability, acrylic resin and polyolefin are preferable as the binder. As the acrylic resin, a composite resin of acryl and silicone is also preferable. Examples of a preferred binder include the following.

"CHEMIPEARL S-120" and "CHEMIPEARL S-75N" (trade names: both are manufactured by MITSUI CHEMICALS, INC.) are included, which are examples of the polyolefin. "JURYMER ET-410" and "JURYMER SEK-301" (trade names: both are manufactured by Nihon Junyaku Co., Ltd.) are included, which are examples of the acrylic resin. "CERANATE WSA1060" and "CERANATE WSA1070" (trade names: both are manufactured by DIC Corp.), and "H7620", "H7630" and "H7650" (trade names: all of them are manufactured by ASAHI KASEI CHEMICALS CORP.) are included, which are examples of the composite resin of acryl and silicone.

The content of the binder in the easy adhesion layer is preferably from 0.05 g/m$^2$ to 5 g/m$^2$ and particularly preferably from 0.08 g/m$^2$ to 3 g/m$^2$. When the content of the binder is 0.05 g/m$^2$ or more, more adequate adhesion may be attained. When the content is 5 g/m$^2$ or less, more adequate surface condition may be attained.

(2) Fine Particles

The easy adhesion layer may include therein at least one kind of fine particles. The easy adhesion layer includes fine particles in an amount of preferably 5% by mass or more with respect to the mass of the whole layer.

Examples of the fine particles include preferably inorganic fine particles such as silica, calcium carbonate, magnesium oxide, magnesium carbonate, or tin oxide. Among these, fine particles of tin oxide and silica are particularly preferable because adhesion is less degraded when they are exposed to wet and heat atmosphere.

The particle diameter of the fine particles is preferably from 10 nm to 700 nm and more preferably from 20 nm to 300 nm. When fine particles having a particle diameter within the above range are used, adequate easy adhesion property may be attained. There is not any particular limitation on the shape of the fine particles, but fine particles having a shape such as spherical, amorphous, or needle-like may be used.

The addition amount of the fine particles in the easy adhesion layer is preferably from 5% by mass to 400% by mass and more preferably from 50% by mass to 300% by mass based on the content of the binder in the easy adhesion layer. When the addition amount of the fine particles is 5% by mass or more, adequate adhesion may be attained when exposed to wet and heat atmosphere. When the addition amount is 400% by mass or less, the easy adhesion layer may have more adequate surface condition.

(3) Cross-Linking Agent

The easy adhesion layer may include therein at least one kind of cross-linking agent.

Examples of the cross-linking agent include cross-linking agents of epoxy type, isocyanate type, melamine type, carbodiimide type, and oxazoline type. Among these, from the viewpoint of securing adhesion after exposure to moisture and heat over time, the oxazoline type cross-linking agent is particularly preferable.

Specific examples of the oxazoline type cross-linking agent include: 2-vinyl-2-oxazoline; 2-vinyl-4-methyl-2-oxazoline; 2-vinyl-5-methyl-2-oxazoline; 2-isopropenyl-2-oxazoline; 2-isopropenyl-4-methyl-2-oxazoline; 2-isopropenyl-5-ethyl-2-oxazoline; 2,2'-bis-(2-oxazoline); 2,2'-methylene-bis-(2-oxazoline); 2,2'-ethylene-bis-(2-oxazoline); 2,2'-trimethylene-bis-(2-oxazoline); 2,2'-tetramethylene-bis-(2-oxazoline); 2,2'-hexamethylene-bis-(2-oxazoline); 2,2'-octamethylene-bis-(2-oxazoline); 2,2'-ethylene-bis-(4,4'-dimethyl-2-oxazoline), 2,2'-p-phenylene-bis-(2-oxazoline); 2,2'-m-phenylene-bis-(2-oxazoline); 2,2'-m-phenylene-bis-(4,4'-dimethyl-2-oxazoline); bis-(2-oxazolynyl cyclohexane) sulfide; and bis-(2-oxazolynyl norbornane) sulfide. In addition, (co)polymers of these compounds may be preferably used.

Further, as a compound having an oxazoline group, "EPOCROS K2010E", "EPOCROS K2020E", "EPOCROS K2030E", "EPOCROS WS500", "EPOCROS WS700" (trade names: all of them are manufactured by NIPPON SHOKUBAI CO., LTD.), and others may be used.

The addition amount of the cross-linking agent in the easy adhesion layer is preferably from 5% by mass to 50% by mass and more preferably from 20% by mass to 40% by mass based on the content of the binder in the easy adhesion layer. When the addition amount of the cross-linking agent is 5% by mass or more, an adequate effect of cross-linking may be attained and the reflection layer does not easily undergo strength degradation or bonding failure. When the addition amount is 50% by mass or less, the pot-life of coating liquid may be kept long.

(4) Additives

To the easy adhesion layer, when needed, a known matte agent such as polystyrene, polymethyl methacrylate or silica, and a known surfactant such as an anionic or nonionic surfactant may be added.

(5) Method of Forming Easy Adhesion Layer

As a method of forming the easy adhesion layer, there is a method of laminating a polymer sheet that has an easy adhesion property to a polyester film, or a coating method. The coating method is preferable because the process is simple and a thin film with a high uniformity may be formed. As the coating method, for instance, known processes including gravure coating and bar coating may be used. The solvent of a coating liquid that is used in the coating method may be either water or an organic solvent such as toluene or methylethyl ketone. The solvent may be used singly or as a mixture of two or more kinds thereof.

(6) Properties

There is not any particular limitation on the thickness of the easy adhesion layer, but generally the thickness is preferably from 0.05 μm to 8 μm and more preferably from 0.1 μm to 5 μm. When the thickness of the easy adhesion layer is 0.05 μm or more, easy adhesion property is easily attained. When the thickness is 8 μm or less, surface condition may be kept more properly.

The easy adhesion layer preferably has transparency, from the viewpoint of not impairing an effect of a colored layer (particularly, reflection layer) when the colored layer is disposed between the easy adhesion layer and the polyester film.

UV Absorption Layer

The polyester film of the present invention may be provided with an UV absorption layer that contains a UV absorber. The UV absorption layer may be disposed in an arbitrary position on the polyester film.

The UV absorber is preferably used by being dissolved or dispersed along with ionomer resin, polyester resin, urethane resin, acrylic resin, polyethylene resin, polypropylene resin, polyamide resin, vinylacetate resin, cellulose ester resin, or the like. The UV absorption layer preferably has a light transmission of 20% or less at a wavelength of 400 nm or less.

Colored Layer

The polyester film of the present invention may be provided with a colored layer. The colored layer contacts the surface of the polyester film directly or is disposed thereon through another layer. The colored layer may include a pigment and a binder.

A first function of the colored layer is to enhance power generation efficiency of the solar cell module by reflecting and returning a part of incident light, which is not used for power generation by solar cells and reaches the backsheet, to the solar cells. A second function thereof is to improve decorativeness of appearance of the solar cell module seen from the front face side thereof. Usually, when a solar cell module is seen from the front face side, the backsheet is seen around the solar cells. By providing the backsheet with the colored layer, the decorativeness thereof may be enhanced more.

(1) Pigment

The colored layer may include therein at least one kind of pigment. The pigment is included in an amount of preferably from 2.5 $g/m^2$ to 8.5 $g/m^2$. A more preferably content of the pigment is in a range of from 4.5 $g/m^2$ to 7.5 $g/m^2$. When the content of the pigment is 2.5 $g/m^2$ or more, required coloring may be easily provided and the reflectance and decorativeness may be adjusted more properly. When the content of the pigment is 8.5 $g/m^2$ or less, the surface condition of the colored layer may be kept more properly.

Examples of the pigment include: an inorganic pigment such as titanium oxide, barium sulfate, silicon oxide, aluminum oxide, magnesium oxide, calcium carbonate, kaolin, talc, ultramarine blue pigment, deep blue pigment or carbon black; and an organic pigment such as phthalocyanine blue or phthalocyanine green. Among these pigments, from the viewpoint of configuring the colored layer as a reflection layer that reflects incident sunlight, a white pigment is preferable. As the white pigment, for instance, titanium oxide, barium sulfate, silicon oxide, aluminum oxide, magnesium oxide, calcium carbonate, kaolin, talc, or the like is preferable.

The average particle diameter of the pigment is preferably from 0.03 μm to 0.8 μm and more preferably from 0.15 μm to 0.5 μm. When the average particle diameter is in the above ranges, light reflectance may be kept more properly.

When the colored layer is configured as the reflection layer that reflects incident sunlight, an addition amount of the pigment in the reflection layer is, although the amount changes depending on the kind and average particle diameter of the pigment used, preferably from 1.5 $g/m^2$ to 15 $g/m^2$ and more preferably from 3 $g/m^2$ to 10 $g/m^2$. When the addition amount is 1.5 $g/m^2$ or more, required reflectance is easily attained. When the addition amount is 15 $g/m^2$ or less, strength of the reflection layer may be kept still higher.

(2) Binder

The colored layer may include therein at least one kind of binder. When the binder is included, the amount thereof is preferably from 15% by mass to 200% by mass and more preferably from 17% by mass to 100% by mass, with respect to the content of the pigment. When the amount of the binder is 15% by mass or more, strength of the colored layer may be kept still higher. When the amount is 200% by mass or less, reflectance and decorativeness may be kept more properly.

As a preferred binder for the colored layer, for instance, polyester, polyurethane, acrylic resin, polyolefin, or the like may be used. The binder is, from the viewpoint of durability, preferably acrylic resin or polyolefin. Further, as the acrylic resin, a composite resin of acryl and silicone is also preferable. Examples of a preferred binder include the following.

"CHEMIPEARL S-120" and "CHEMIPEARL S-75N" (trade names: both are manufactured by MITSUI CHEMICALS, INC.) are included, which are examples of the polyolefin. "JURYMER ET-410" and "JURYMER SEK-301" (trade names: both are manufactured by Nihon Junyaku Co., Ltd.) are included, which are examples of the acrylic resin. "CERANATE WSA1060" and "CERANATE WSA1070" (trade names: both are manufactured by DIC Corp.) and "H7620", "H7630", and "H7650" (trade names: all of them are manufactured by ASAHI KASEI CHEMICALS CORP.) are included, which are examples of the composite resin of acryl and silicone.

(3) Additives

To the colored layer, besides the binder and the pigment, a cross-linking agent, a surfactant, filler, or the like may be further added when needed.

Examples of the cross-linking agent include cross-linking agents of epoxy type, isocyanate type, melamine type, carbodiimide type, and oxazoline type. The addition amount of the cross-linking agent in the colored layer is preferably from 5% by mass to 50% by mass and more preferably from 10% by mass to 40% by mass based on the content of the binder in the colored layer. When the addition amount of the cross-linking agent is 5% by mass or more, a sufficient cross-linking effect may be obtained and strength and adhesiveness of the colored layer may be kept high. When the amount is 50% by mass or less, the pot life of coating liquid may be kept longer.

Examples of the surfactant include known surfactants such as anionic or nonionic ones. The addition amount of the surfactant is preferably from 0.1 $mg/m^2$ to 15 $mg/m^2$ and more preferably from 0.5 $mg/m^2$ to 5 $mg/m^2$. When the addition amount of the surfactant is 0.1 $mg/m^2$ or more, repelling is effectively prevented. When the addition amount is 15 $mg/m^2$ or less, excellent adhesion may be attained.

Further, besides the above pigment, filler such as silica or the like may be added to the colored layer. The addition amount of the filler is preferably 20% by mass or less based on the content of the binder in the colored layer, and more preferably 15% by mass or less. The inclusion of the filler enables improvement in the strength of the colored layer. When the addition amount of the filler is 20% by mass or less, adequate light reflecting performance (reflectance) or decorativeness may be attained because the ratio of the pigment may be preserved.

(4) Method of Forming Colored Layer

Examples of a method of forming the colored layer include: a method of laminating a polymer sheet that includes a pigment therein to the polyester film; a method of co-extruding the colored layer at the time when the polyester film is formed; and a coating method. Among these, the coating method is preferable because it is simple and a thin film with a high uniformity may be formed. As the coating method, for instance, known methods including gravure coating and bar coating may be used. The solvent of coating liquid that is used in the coating method may be either water or an organic solvent such as toluene or methylethyl ketone. However, from the viewpoint of environmental burden, water is preferably selected as the solvent.

The solvent may be used singly or as a mixture of two or more kinds thereof.

(5) Properties

The colored layer preferably includes a white pigment and is configured as a reflection layer. The reflection layer has a reflectance of preferably 75% or more at 550 nm. When the reflectance is 75% or more, an effect of enhancing power generation efficiency is high because the sunlight that passes through solar cells and is not used for power generation may be retuned to the cells.

The thickness of the reflection layer is preferably from 1 μm to 20 μm and more preferably from 1.5 μm to 10 μm. When the thickness is 1 μm or more, required decorativeness or reflectance is easily attained. When the thickness is 20 μm or less, surface condition may be kept more properly.

Undercoat Layer

The polyester film of the present invention may be provided with an undercoat layer. For instance, when the colored layer is provided, the undercoat layer may be provided between the colored layer and the polyester film. The undercoat layer may include a binder, a cross-linking agent, and a surfactant.

Examples of the binder included in the undercoat layer include: polyester, polyurethane, acrylic resin, and polyolefin. To the undercoat layer, besides the binder, a cross-linking agent such as an epoxy type, an isocyanate type, a melamine type, a carbodiimide type, or an oxazoline type, a surfactant such as anionic or nonionic surfactant, filler such as silica, and others may be added.

There is not any particular limitation on the method of forming the undercoat layer by coating and the solvent of coating liquid used therein. As the coating method, for instance, gravure coating or bar coating may be used. The solvent may be water or an organic solvent such as toluene or methylethyl ketone. The solvent may be used singly or as a mixture of two or more kinds thereof.

Coating may be applied on a polyester film after biaxial or uniaxial stretching. After coating is applied, the film may be further stretched in a direction different from the initial stretching direction. Furthermore, coating may be applied on a polyester film before stretching, and then the film is stretched in two directions.

The thickness of the undercoat layer is preferably from 0.05 μm to 2 μm and more preferably from 0.1 μm to 1.5 μm. When the thickness is 0.05 μm or more, required adhesion is easily attained. When the thickness is 2 μm or less, surface condition may be kept properly.

Fluoro Resin Layer and Si Resin Layer

It is preferable that the polyester film of the present invention is provided with at least one of a fluoro resin layer and a Si resin layer. By the fluoro resin layer or Si resin layer, the polyester film may have antifouling property and improved weather resistance on the surface thereof. Specifically, a fluoro resin coating layer described in JP-A Nos. 2007-35694 and 2008-28294 and WO2007/063698 is preferably included.

Further, a fluoro resin film such as "TEDLAR" (trade name: manufactured by Du Pont Kabushiki Kaisha) may be preferably bonded thereto.

The thicknesses of the fluoro resin layer and the Si resin layer are each preferably from 1 μm to 50 μm and more preferably from 3 μm to 40 μm.

Inorganic Layer

It is also preferable that the polyester film of the present invention is provided with an inorganic layer.

The polyester film of the present invention, in a preferred mode thereof, has an inorganic layer. By the inorganic layer, a function as a damp-proof layer or a gas-barrier layer, which prevents penetration of water or gas into the polyester film, may be imparted. The inorganic layer may be provided on either the front or rear face of the polyester film, but from the viewpoint of waterproof, damp-proof or the like, the inorganic layer is provided preferably on a side of the polyester film opposite to the side (namely, the side on which the colored layer and easy adhesion layer are formed) thereof that faces to the cell side substrate.

The water vapor permeability (moisture permeability) of the inorganic layer is preferably from $10^0$ g/m²·d to $10^{-6}$ g/m²·d, more preferably from $10^1$ g/m²·d to $10^{-5}$ g/m²·d, and still more preferably from $10^2$ g/m²·d to $10^{-4}$ g/m²·d.

In order to form an inorganic layer that has such a moisture permeability as described above, the following dry process is preferably used.

As a method of forming a gas barrier inorganic layer (hereinafter, also referred to as "gas barrier layer") by using a dry process, a vacuum vapor deposition method such as resistance heating vapor deposition, electron beam vapor deposition, induction heating vapor deposition, or a plasma or ion beam assisted method; a sputtering method such as reactive sputtering, ion-beam sputtering, or ECR (electron cyclotron resonance) sputtering; a physical vacuum deposition (PVD) method such as ion plating; and a chemical vapor deposition (CVD) method that uses heat, light, or plasma, may be used. Among these, the vacuum vapor deposition method in which a film is deposited under vacuum is preferable.

Here, when the material that composes the gas barrier layer includes as a main component an inorganic oxide, an inorganic nitride, an inorganic oxynitride, an inorganic halide, an inorganic sulfide or the like, a material that has the same composition as that of the resulting gas barrier layer may be directly evaporated and deposited on a substrate. However, when using this method, the composition may change during evaporation, and as a result, the resulting film sometimes does not exhibit uniform properties. Therefore, the following methods are preferred: (1) a material having the same composition as that of the resulting barrier layer is used as an evaporation source; and oxygen gas in the case of inorganic oxide, nitrogen gas in the case of inorganic nitride, a mixed gas of oxygen gas and nitrogen gas in the case of inorganic oxynitride, halogen gas in the case of inorganic halide, or a sulfur gas in the case of inorganic sulfide is introduced supplementarily into the system while the material is evaporated; (2) an inorganic material is used as the evaporation source; and while the material is evaporated, oxygen gas in the case of inorganic oxide, nitrogen gas in the case of inorganic nitride, a mixed gas of oxygen gas and nitrogen gas in the case of inorganic oxynitride, halogen gas in the case of inorganic halide, or a sulfur gas in the case of inorganic sulfide is introduced into the system, so that the inorganic material and the introduced gas are reacted and deposited on the surface of a substrate; and (3) an inorganic material is used as the evaporation source; the inorganic material is evaporated, so that a layer of the inorganic material is formed; and then the layer is left in an atmosphere of oxygen gas in the case of inorganic oxide, nitrogen gas in the case of inorganic nitride, a mixed gas of oxygen gas and nitrogen gas in the case of inorganic oxynitride, halogen gas in the case of inorganic halide, or a sulfur gas in the case of inorganic sulfide, so that the film of the inorganic material reacts with the gas introduced.

Among these, from the viewpoint of easiness of evaporating the source, the method described in (2) or (3) is more preferably used. Further, from the viewpoint of easiness in film quality control, the method described in (2) is still more preferably used. When the barrier layer is composed of inorganic oxide, a method may be used in which an inorganic material is used as the evaporation source; the material is evaporated, so that a layer of the inorganic material is formed; and then the layer is left in the air, so that the inorganic material is oxidized spontaneously. This method is also preferable because the layer may be formed easily.

It is also preferable that an aluminum foil is attached and used as the barrier layer. The thickness is preferably from 1 μm to 30 μm. When the thickness is 1 μm or more, water does not easily penetrate into the polyester film over time (under thermal condition), so that hydrolysis does not occur easily. When the thickness is 30 μm or less, the barrier layer does not become too thick, so that the film is not deformed by the stress of the barrier layer.

Solar Cell Power Generation Module

The solar cell power generation module of the present invention includes the aforementioned polyester film (which may be a backsheet) of the present invention. Preferably, the module further includes a transparent substrate (for instance, a glass substrate or the like) positioned at the incident sunlight side, solar cell devices that convent light energy of sunlight into electric energy, and a sealing material that seals the solar cell devices.

The solar cell power generation module may have a configuration in which, as shown in FIG. 1, power generation devices (solar cell devices) 3 that are connected to lead wires (not shown in the FIGURE) taking electricity from the devices are sealed with a sealing material 2 such as an ethylene vinyl acetate copolymer (EVA) resin; they are sandwiched between a transparent substrate 4 such as glass and a backsheet 1 that includes the polyester film of the present invention; and they are bonded together.

As the solar cell devices, various kinds of known solar cell devices are usable, which include: a silicon type such as single crystalline silicon, polycrystalline silicon, or amorphous silicon; and a III-V or II-VI group compound semiconductor such as copper-indium-gallium-selenium, copper-indium-selenium, cadmium-tellurium, or gallium-arsenic.

According to an aspect of the invention, there are provided the following embodiments <1> to <20>.

<1> A polyester resin composition comprising: a polyester resin; a titanium compound derived from a catalyst; and a phosphorous compound, wherein the following formula (1) and formula (2) are satisfied:

$$0.10 < Ti/P < 0.20 \quad (1)$$

wherein Ti/P represents a mass content ratio of titanium element to phosphorus element in the polyester resin composition $$0.0090 < \Delta IV \leq 0.0185 (dL/g/hr) \quad (2)$$

wherein ΔIV represents an increase in an intrinsic viscosity of the polyester resin composition per hour under conditions of 225° C. and 50 Pa.

<2> The polyester resin composition according to <1>, wherein the titanium compound is an organic chelate titanium complex having an organic acid as a ligand.

<3> The polyester resin composition according to <1> or <2>, wherein the phosphorus compound is a compound represented by the following formula (3):

$$(RO)_3P=O \quad (3)$$

wherein R represents an alkyl group having from 1 to 3 carbon atoms.

<4> The polyester resin composition according to any one of <1> to <3>, wherein the following formula (4) and formula (5) are further satisfied:

$$1 \text{ ppm} < \text{a mass content of titanium element in the polyester resin composition} \leq 30 \text{ ppm} \quad (4)$$

$$50 \text{ ppm} < \text{a mass content of phosphorus element in the polyester resin composition} \leq 90 \text{ ppm} \quad (5).$$

<5> The polyester resin composition according to any one of <1> to <4>, wherein the amount of terminal COOH groups contained in the polyester resin composition is 25 eq/t or less.

<6> The polyester resin composition according to any one of <1> to <5>, wherein a common logarithm of R (Log R) is 6.9 or less, wherein R represents a volume resistivity (Ω·m) of the polyester resin composition.

<7> The polyester resin composition according to any one of <1> to <6>, further comprising 50 ppm by mass or more of at least one metal selected from the group consisting of an alkali metal, an alkaline earth metal, an iron-group metal, manganese, tin, lead, and zinc.

<8> A method of producing a polyester resin composition, comprising:

(A) reacting a dicarboxylic acid component and a diol component through an esterification reaction to obtain an esterification reaction product;

(B) performing a transesterification reaction of the esterification reaction product to obtain a condensation polymerization product; and adding a phosphorus compound to a reaction liquid, before the esterification reaction in step (A) is terminated but after a titanium compound is added to the reaction liquid, so as to satisfy the following formula (1) and formula (2):

$$0.10 < Ti/P < 0.20 \quad (1)$$

wherein Ti/P represents a mass content ratio of titanium element to phosphorus element in the polyester resin composition $$0.0090 < \Delta IV \leq 0.0185 (dL/g/hr) \quad (2)$$

wherein ΔIV represents an increase in an intrinsic viscosity of the polyester resin composition per hour under conditions of 225° C. and 50 Pa.

<9> The method of producing a polyester resin composition according to <8>, further comprising adding a compound containing at least one metal selected from the group consisting of an alkali metal, an alkaline earth metal, an iron-group metal, manganese, tin, lead, and zinc to the reaction liquid before the addition of the phosphorus compound.

<10> The method of producing a polyester resin composition according to <8> or <9>, wherein the addition of the phosphorus compound is performed by adding an addition solution, which is prepared by dissolving the phosphorus compound in a solution containing the diol component at about 25° C., to the reaction liquid before step (A) is terminated.

<11> The method of producing a polyester resin composition according to <10>, wherein the content of the phosphorus compound in the addition solution is from 1% by mass to 10% by mass with respect to a total mass of the addition solution.

<12> The method of producing a polyester resin composition according to any one of <8> to <11>, wherein a polymerization temperature is 280° C. or lower.

<13> The method of producing a polyester resin composition according to any one of <8> to <12>, further comprising (C) performing solid-state polymerization of the condensation polymerization product obtained in step (B).

<14> The method of producing a polyester resin composition according to <13>, wherein the solid-state polymerization is performed under a pressure of from 1 Pa to 1000 Pa.

<15> The method of producing a polyester resin composition according to <13> or <14>, wherein the solid-state polymerization is performed in a nitrogen atmosphere.

<16> A polyester resin composition obtained by the method according to any one of <8> to <15>.

<17> A polyester film comprising the polyester resin composition according to any one of <1> to <7> and <16> and having a thickness of from 250 μm to 500 μm.

<18> The polyester film according to <17>, which is a polyester film for a solar cell.

<19> The polyester film according to <17> or <18>, wherein a storage time until elongation at break of the polyester film after storage in an atmosphere of 85° C. and 85% RH becomes 50% of elongation at break of the polyester film before the storage is 4000 hours or longer.

<20> A solar cell power generation module comprising the polyester film according to any one of <17> to <19>.

The present invention provides a polyester resin composition having an excellent hydrolysis resistance and a method of producing the composition.

Further, the present invention provides a polyester film that includes a polyester resin composition having an excellent hydrolysis resistance.

Further, the present invention provides a solar cell power generation module that exhibits stable power generation performance over a long period of time.

EXAMPLES

Hereinafter, the present invention will be further described in detail with reference to the following Examples, but the invention is not limited to the Examples. Note that, unless otherwise noted, "part(s)" is in terms of mass.

Example 1

1. Preparation of Polyester Resin Composition (Melt Polymerization Step)
Step (A)
High purity terephthalic acid in an amount of 4.7 tons and ethylene glycol in an amount of 1.8 tons were mixed over 90 minutes to form slurry. The slurry was continuously supplied at a flow rate of 3800 kg/hour to a first esterification reactor. Further, an ethylene glycol solution of a citric acid chelate titanium complex having citric acid coordinated to Ti metal ("VERTEC AC-420" (trade name), manufactured by Johnson Matthey Corp.) was supplied continuously. Reaction was carried out at a reactor inside temperature of 250° C. and an average retention time of about 4.3 hours with stirring. The citric acid chelate titanium complex was continuously added in a manner that the addition amount of Ti element was 9 ppm. The acid value of the resulting oligomer was 600 eq/t.

The resulting reaction mixture was transferred to a second esterification reactor tank, and reacted with stirring at a reactor inside temperature of 250° C. and an average retention time of 1.2 hours, so that an oligomer having an acid value of 200 eq/t was obtained. The inside of the second esterification reactor tank was parted into three zones. At a second zone, an ethylene glycol solution of magnesium acetate was continuously supplied in a manner that the addition amount of Mg element was 75 ppm. After that, at a third zone, an ethylene glycol solution of trimethyl phosphate was continuously supplied in a manner that the addition amount of P element was 65 ppm.

In this manner, an esterification reaction product was obtained.

Note that, the ethylene glycol solution of trimethyl phosphate was prepared by adding a 25° C. trimethyl phosphate liquid to a 25° C. ethylene glycol liquid, and stirring them at 25° C. for 2 hours. (phosphate compound content in the solution: 3.8% by mass)

Step (B)
The esterification reaction product obtained in step (A) was supplied continuously to a first condensation polymerization reactor tank. Condensation polymerization (transesterification reaction) was carried out with stirring at a reaction temperature of 270° C., a reactor inside pressure of 20 Torr ($2.67 \times 10^{-3}$ MPa), and an average retention time of about 1.8 hours.

Further, the reaction product was transferred from the first condensation polymerization reactor tank to a second condensation polymerization reactor tank. In this reactor tank, reaction (transesterification reaction) was carried out with stirring at a reactor inside temperature of 276° C., a reactor inside pressure of 5 Torr ($6.67 \times 10^{-4}$ MPa), and a retention time of about 1.2 hours.

After that, the reaction product was transferred from the second condensation polymerization reactor tank to a third condensation polymerization reactor tank. In this reactor tank, reaction (transesterification reaction) was carried out at a reactor inside temperature of 278° C., a reactor inside pressure of 1.5 Torr ($2.0 \times 10^{-4}$ MPa) and a retention time of 1.5 hours, so that a reaction product (polyethylene terephthalate (PET)) was obtained.

Then, the resulting reaction product was extruded into cold water in a strand form and immediately cut, so that polyester resin composition pellets (cross section: about 4 mm of long axis and about 2 mm of short axis, length: about 3 mm) were prepared. Further, these pellets may be vacuum-dried at 180° C., fed into a raw material hopper of a uniaxial kneading extruder that has a screw in a cylinder thereof, and extruded so as to form a film.

The resulting polyester resin composition was measured as shown below with a high resolution inductively coupled plasma mass spectrometer (HR-ICP-MS: "ATTOM" (trade name), manufactured by SII NanoTechnology Inc.). The results were: Ti=9 ppm, Mg=75 ppm, and P=60 ppm. P was slightly reduced as compared with the initial addition amount. Volatilization during polymerization may be considered.

Step (C) (Solid-State Polymerization Step)
The pellets obtained above were subjected to heat treatment under a reduced pressure of 50 Pa at 210° C. for 30 hours with a rotary vacuum polymerization apparatus. After that, 25° C. nitrogen gas was passed through the vacuum polymerization apparatus to cool the pellets to 25° C. In this way, a polyester resin composition was obtained.

Evaluation of Polyester Resin Composition
For the polyester resin composition obtained in Example 1, the amount of terminal COOH groups, ΔIV, and Log R were measured by the following methods.

The results are shown in Table 1.

Amount of Terminal COOH Groups

For each of the polyester resin composition obtained by step (A) and step (B) (melt polymerization step) and the polyester resin composition further subjected to step (C) (solid-state polymerization step), the amount of terminal COOH groups was measured by titration in accordance with the method described in H. A. Pohl, Anal. Chem. 26 (1954) p. 2145. Specifically, the polyester resin composition was dissolved in benzyl alcohol at 205° C.; a phenol red indicator was added; and titration was performed with a water/methanol/benzyl alcohol solution of sodium hydroxide.

IV Value

The pellets of the polyester resin composition obtained by step (A) and step (B) (melt polymerization step) and the pellets of the polyester resin composition further subjected to step (C) (solid-state polymerization step) were respectively dissolved in a mixed solution of 1,1,2,2-tetrachlorethane/phenol (=2/3 [mass ratio]), and the relative viscosity $\eta_0$ at 25° C. was measured using an Ubbelohde type viscometer. The specific viscosity ($\eta_{sp}$) determined from this relative viscosity and the concentration c were used to determine $\eta_{sp}/c$, and the intrinsic viscosity (IV value) was calculated by a three-point method.

ΔIV Value

For the pellets (cross-section: major axis about 4 mm, minor axis about 2 mm, length: about 3 mm) of the polyester resin composition obtained through steps (A) to (C) in Example 1, ΔIV value was obtained by measuring intrinsic viscosity (IV) under conditions of 225° C. and 50 Pa in accordance with the aforementioned method, and calculating an increase per unit time.

Log R

The volume resistivity R (Ω·m) of the polyester resin composition obtained in Example 1 was measured by the aforementioned measurement method. The common logarithm of the resulting measured value was represented by Log R.

2. Preparation of Polyester Film

Extrusion Molding

The pellets obtained after the solid-state polymerization as describe above were dried, so that the water content thereof was reduced to 20 ppm or less. After that, the pellets were fed into a hopper of a uniaxial kneading extruder with a diameter of 50 mm, melted at 270° C., and extruded. The resulting melted body (melt) was passed through a gear pump and a filter (having a pore diameter of 20 μm), and then the melt was extruded from a die onto a 20° C. cooling roll to obtain an amorphous sheet. Note that, the extruded melt was adhered to the cooling roll by using the electrostatic charging method.

Stretching

The unstretched film that was extruded onto the cooling roll by the method described above and solidified was successively biaxially stretched by the method below to obtain a 175 μm thick polyester film.

Stretching Method (a) Longitudinal Stretching

The unstretched film was passed through two pairs of nip rolls having different circumferential speed from each other so as to be stretched in a longitudinal direction (conveying direction). Note that, stretching was performed under conditions: preheating temperature was 95° C.; stretching temperature was 95° C.; stretching ratio was 3.5 times; and stretching speed was 3000%/second.

(b) Width Stretching

The longitudinally stretched film was stretched in a width direction with a tenter under the following conditions.

Conditions

Preheating temperature: 110° C.,
Stretching temperature: 120° C.,
Stretching ratio: 3.9 times, and
Stretching speed: 70%/second.

Heat Fixing and Relaxation

Subsequently, the stretched film after longitudinal and width stretching was subjected to heat fixing under the following conditions. Further, after heat fixing, relaxation was carried out under the following conditions at a narrowed tenter width.

Heat Fixing Conditions

Heat fixing temperature: 215° C. and
Heat fixing time: 2 seconds.

Relaxation Conditions

Relaxation temperature: 210° C. and
Percent of relaxation: 2%.

Winding Up

After heat fixing and relaxation, both ends of the film were subjected to 10 cm trimming respectively. After that, a press processing (knurling) of 10 mm width was applied on both ends of the film, and then the film was wound up at a tension of 25 kg/m. Note that, the film width was 1.5 m and the film length was 2000 m.

In this way, PET films and PEN films (hereinafter, collectively referred to as "sample films") of the present invention and for comparison were prepared.

Evaluation of Polyester Films

For the polyester film obtained in Example 1, the retention half-life (hour) of elongation at break thereof was measured by the following method.

The results are shown in Table 1.

Retention Half-Life of Elongation at Break (Hour)

The retention half-life of elongation at break was evaluated as follows: the polyester film obtained in Example 1 was subjected to storage treatment (heating treatment) under conditions of 85° C. and 85% of relative humidity; a storage time until the elongation at break (%) of the polyester film after storage became 50% of the elongation at break (%) of the polyester film before storage was measured. Details of elongation at break measurement are as described above.

The longer the retention half-life of elongation at break, more excellent the hydrolysis resistance of the polyester resin composition and the polyester film obtained from the composition.

3. Preparation of Solar Cell Backsheet

A backsheet for a solar cell was prepared by using the polyester film prepared in Example 1.

On the one face of the polyester film prepared, the following reflection layer (i) and easy adhesion layer (ii) were applied in this order by coating.

(i) Reflection Layer (Colored Layer)

At first, components having the following composition were mixed and subjected to dispersion treatment for 1 hour with a dyno-mill disperser, so that pigment dispersion was prepared.

Composition of Pigment Dispersion

Titanium dioxide ("TIPAQUE R-780-2" (trade name), manufactured by ISHIHARA SANGYO KAISHA, LTD., 100% by mass of solid content): 39.9 parts, Polyvinylalcohol ("PVA-105" (trade name), manufactured by KURARAY CO., LTD., 10% of solid content): 8.0 parts, Surfactant ("DEMOL EP" (trade name), manufactured by Kao Corp., 25% of solid content): 0.5 part, and Distilled water: 51.6 parts.

Then, components, including the resulting pigment dispersion, having the following composition were mixed, so that a coating liquid for forming a reflection layer was prepared.

Composition of Coating Liquid for Forming Reflection Layer

Above pigment dispersion: 71.4 parts,

Polyacrylic resin water dispersion liquid (binder: "JURYMER ET410" (trade name), manufactured by Nihon Junyaku Co., Ltd., 30% by mass of solid content): 17.1 parts, Polyoxyalkylene alkylether ("NAROACTY CL95" (trade name), manufactured by Sanyo Chemical Industries, Ltd., 1% by mass of solid content): 2.7 parts, Oxazoline compound (cross-linking agent: "EPOCROS WS-700" (trade name), manufactured by NIPPON SHOKUBAI CO., LTD., 25% by mass of solid content): 1.8 parts, and Distilled water: 7.0 parts.

Thus obtained coating liquid for forming a reflection layer was applied on a sample film with a bar coater, and dried at 180° C. for 1 minute to form a reflection layer (white layer) with a titanium dioxide coating amount of 6.5 g/m$^2$.

(ii) Easy Adhesion Layer

Components with the following composition were mixed to prepare a coating liquid for forming an easy adhesion layer. The coating liquid was applied in a coating amount of binder of 0.09 g/m$^2$ onto the reflection layer. Then, 1 (one) minute drying at 180° C. was performed. In this way, an easy adhesion layer was formed.

Composition of Coating Liquid for Forming Easy Adhesion Layer

Polyolefin resin water dispersion liquid (binder: "CHEMIPEARL S75N" (trade name), manufactured by MITSUI CHEMICALS, INC., 24% by mass of solid content): 5.2 parts, Polyoxyalkylene alkylether ("NAROACTY CL95" (trade name), Sanyo Chemical Industries, Ltd., 1% by mass of solid content): 7.8 parts, Oxazoline compound ("EPOCROS WS-700" (trade name), manufactured by NIPPON SHOKUBAI CO., LTD., 25% by mass of solid content): 0.8 part, Silica fine particle water dispersion ("AEROSIL OX-50" (trade name), manufactured by Nippon Aerosil Co., Ltd., 10% by mass of solid content): 2.9 parts, and Distilled water: 83.3 parts.

After that, onto a side of the polyester film opposite to the side thereof having the reflection layer and the easy adhesion layer formed thereon, the following undercoat layer (iii), barrier layer (iv), and antifouling layer (v) were applied by coating successively from the polyester film side.

(iii) Undercoat Layer

Components with the following composition were mixed to prepare a coating liquid for forming an undercoat layer. The coating liquid was applied onto the polyester film and dried at 180° C. for 1 (one) minute to form an undercoat layer (dried coating amount: about 0.1 g/m$^2$).

Composition of Coating Liquid for Forming Undercoat Layer

Polyester resin ("VYLONAL MD-1200" (trade name), manufactured by TOYOBO CO., LTD., 17% by mass of solid content): 1.7 parts, Polyester resin ("PESRESIN A-520" (trade name), manufactured by TAKAMATSU OIL&FAT CO., LTD., 30% by mass of solid content): 3.8 parts, Polyoxyalkylene alkylether ("NAROACTY CL95" (trade name), Sanyo Chemical Industries, Ltd., 1% by mass of solid content): 1.5% by mass, Carbodiimide compound ("CARBODILITE V-02-L2" (trade name), manufactured by Nisshinbo Industries, Inc., 10% by mass of solid content): 1.3 parts, and Distilled water: 91.7 parts.

(iv) Barrier Layer

Subsequently, on the surface of thus formed undercoat layer, an 800 angstroms thick vacuum deposition film of silicon oxide was formed under the following vacuum deposition conditions. The film served as a barrier layer.

Vacuum Deposition Conditions

Reactive gas mixing ratio (unit: slm): hexamethyl disiloxane/oxygen gas/helium=1/10/10, Vacuum degree inside vacuum chamber: $5.0 \times 10^{-6}$ mbar, Vacuum degree inside deposition chamber: $6.0 \times 10^{-2}$ mbar, Electric power supplied to cooling and electrode drums: 20 kW, and Film conveying speed: 80 m/minute.

(v) Antifouling Layer

As shown below, coating liquids for forming a first antifouling layer and a second antifouling layer were prepared. The coating liquid for forming the first antifouling layer and the coating liquid for forming the second antifouling layer were coated in this order on the barrier layer, so that an antifouling layer having a bi-layer structure was formed by coating.

First Antifouling Layer

Preparation of Coating Liquid for Forming First Antifouling Layer

Components with the following composition were mixed to prepare a coating liquid for forming the first antifouling layer.

Composition of Coating Liquid

"CERANATE WSA1070" (trade name: manufactured by DIC Corp.): 45.9 parts,

Oxazoline compound (cross-linking agent: "EPOCROS WS-700" (trade name), manufactured by NIPPON SHOKUBAI CO., LTD., 25% by mass of solid content): 7.7 parts, Polyoxyalkylene alkylether ("NAROACTY CL95" (trade name), Sanyo Chemical Industries, Ltd., 1% by mass of solid content): 2.0 parts, Pigment dispersion used for the reflection layer: 33.0 parts, and Distilled water: 11.4 parts.

Preparation of First Antifouling Layer

The resulting coating liquid was applied on the barrier layer in a coated amount of binder of 3.0 g/m$^2$, and dried at 180° C. for 1 minute to form the first antifouling layer.

Preparation of Coating Liquid for Forming Second Antifouling Layer

Components with the following composition were mixed to prepare a coating liquid for forming the second antifouling layer.

Composition of Coating Liquid

Fluoro binder ("OBBLIGATO" (trade name, manufactured by AGC COAT-TECH CO., LTD.): 45.9 parts,
Oxazoline compound (cross-linking agent: "EPOCROS WS-700" (trade name), manufactured by NIPPON SHOKUBAI CO., LTD., 25% by mass of solid content): 7.7 parts,
Polyoxyalkylene alkylether ("NAROACTY CL95" (trade name), Sanyo Chemical Industries, Ltd., 1% by mass of solid content): 2.0 parts,
Pigment dispersion prepared for forming the reflection layer: 33.0 parts, and
Distilled water: 11.4 parts.

Preparation of Second Antifouling Layer

The resulting coating liquid was applied on the first antifouling layer, which was formed on the barrier layer, in a coated amount of binder of 2.0 g/m², and dried at 180° C. for 1 minute to form the second antifouling layer.

In this way, a backsheet that had the reflection layer and the easy adhesion layer on the one side of the polyester film, and the undercoat layer, the barrier layer, and the antifouling layers on the other side thereof was prepared.

4. Fabrication of Solar Cell

The backsheet prepared as described above was bonded to transparent filler in a manner that the structure shown in the FIG. 1 of JP-A No. 2009-158952 was attained, so that a solar cell power generation module was fabricated. At this time, the backsheet was bonded in a manner that the easy adhesion layer of the backsheet contacted the transparent filler in which solar cell devices were embedded.

Examples 2 to 17 and Comparative Examples 1 to 6

Polyester resin compositions of Examples 2 to 17 and Comparative Examples 1 to 6 were prepared substantially similar to Example 1, except that the conditions under which the polyester resin composition was prepared in Example 1 were changed as described below. Further, polyester films, solar cell backsheets, and solar cells were prepared substantially similar to Example 1 by using the resulting respective polyester resin compositions.

Furthermore, Examples 2 to 17 and Comparative Examples 1 to 6 were subjected to evaluation substantially similar to Example 1. The results are shown in Table 1.

In Table 1, the ΔIV values of Comparative Example 1 and Comparative Example 2 were values obtained by measurement using polyester resins which was subjected to step (B) but did not reach the target IV value.

In Table 1, ethylene glycol and 1,4-butanediol are abbreviated as "EG" and "BD", respectively.

Example 2

The order of adding the titanium compound, the magnesium compound (magnesium acetate), and the phosphorus compound in step (A) was changed to the order of adding the magnesium compound, the titanium compound, and the phosphorus compound in this order.

Example 3

The order of adding the titanium compound, the magnesium compound, and the phosphorus compound in step (A) was changed to the order of adding the titanium compound and the magnesium compound at the same time and then adding the phosphorus compound.

Examples 4 to 7

The amounts of the titanium compound and the phosphorus compound that were used in step (A) were changed to the amounts shown in Table 1.

Example 8

In the preparation of the addition solution that was used in step (A), the temperature at which the phosphorus compound was added to ethylene glycol was changed from 25° C. to 80° C.

Examples 9 and 10

In the preparation of the addition solution that was used in step (A), the content of the phosphorus compound in the addition solution was change to the content shown in Table 1.

Example 11

The temperature of the third condensation polymerization reactor tank in step (B) was changed to the temperature shown in Table 1, and the retention time was changed to 1.7 hours.

Example 12

The temperature of the third condensation polymerization reactor tank in step (B) was changed to the temperature shown in Table 1, and the retention time was changed to 2.3 hours.

Examples 13 and 14

The temperature of the third condensation polymerization reactor tank in step (B) was changed to the temperature as shown in Table 1 and the retention time was changed to 2.3 hours. Further, the solid-state polymerization conditions in step (C) were changed as shown in Table 1. The solid-state polymerization in Example 14 was carried out at normal pressure under nitrogen atmosphere.

Example 15

The temperature in the third condensation polymerization reactor tank in step (B) was change to the temperature shown in Table 1, and further the solid-state polymerization condition in step (C) was changed as shown in Table 1.

Example 16

Among the raw materials used in step (A), the dicarboxylic acid was changed from terephthalic acid to 2,6-naphthaline dicarboxylic acid. The resulting polyester resin was PEN resin.

Example 17

Among the raw materials used in step (A), the diol was changed from ethylene glycol to 1,4-butanediol. The resulting polyester resin was PBT resin.

Example 18

The amounts of the titanium compound and the phosphorus compound were changed to the amounts shown in Table 1.

The titanium compound and the phosphorous compound were added in this order successively. The magnesium compound was not added.

Comparative Example 1

The order of adding the titanium compound, the magnesium compound, and the phosphorus compound in step (A) was changed to the order of adding the phosphorus compound, the titanium compound, and the magnesium compound in this order.

As a result, even though the reaction time in step (B) was increased twice as compared with Example 1, the increased polymerization degree showed only a value of IV=0.29 and did not reach a target value of IV=0.64. Due to this, it was not possible to carry out pellet preparation of step (B), step (C), and film preparation and stretching. Film formation was impossible.

Comparative Examples 2

The order of adding the titanium compound, the magnesium compound, and the phosphorus compound in step (A) was changed to the order of adding the titanium compound, the phosphorus compound, and the magnesium compound in this order.

As a result, even though the reaction time in step (B) was increased twice as compared with Example 1, the increased polymerization degree showed only a value of IV=0.28 and did not reach a target value of IV=0.64. Due to this, it was not possible to carry out pellet preparation of step (B), step (C), and film preparation and stretching. Film formation was impossible.

Comparative Example 3

The order of adding the titanium compound, the magnesium compound, and the phosphorus compound in step (A) was changed to the order of adding the phosphorus compound, the magnesium compound, and the titanium compound in this order.

Comparative Example 4

The order of adding the titanium compound, the magnesium compound, and the phosphorus compound in step (A) was changed to the order of adding the magnesium compound, the phosphorus compound, and the titanium compound in this order.

Comparative Examples 5 and 6

The amount of the phosphorus compound used in step (A) was changed to the amount as shown in Table 1.

As a result, even though the reaction time in step (B) was increased twice as compared with Example 1, the increased polymerization degree showed only a value of IV=0.21 and did not reach a target value of IV=0.64. Due to this, it was not possible to carry out pellet preparation of step (B), step (C), and film preparation and stretching. Film formation was impossible.

Comparative Examples 7 to 9

Polyester resin compositions and polyester films were prepared as follows: Comparative Example 7 was performed substantially similar to the example 1 of JP-A No. 2007-204538; Comparative Example 8 was performed substantially similar to the example 3 of JP-A No. 2004-197075; and Comparative Example 9 was performed substantially similar to the reference example 2 of Japanese Patent No. 3396995.

Further, Comparative Examples 7 to 9 were evaluated substantially similar to Example 1. The results were shown in Table 1.

Comparative Example 10

A polyester resin composition was prepared substantially similar to Example 1, except that the magnesium compound and the phosphorus compound were not used in step (A) of Example 1. By using the resulting polyester resin composition, a polyester film, a solar cell backsheet, and a solar cell were prepared substantially similar to Example 1.

Further, evaluation substantially similar to Example 1 was performed. The results were shown in Table 1.

Comparative Example 11

A polyester resin composition was prepared substantially similar to Example 1, except that the phosphorous compound was not used in step (A) of Example 1. By using the resulting polyester resin composition, a polyester film, a solar cell backsheet, and a solar cell were prepared substantially similar to Example 1.

Further, evaluation substantially similar to Example 1 was performed. The results were shown in Table 1.

TABLE 1

| | Resin | Ti (ppm) | Mg (ppm) | P (ppm) | Ti/P | Addition order | P compd addition method | P compd content in addition solution (% by mass) | Polymerization temperature in condensation polymerization step (third condensation polymerization tank) (° C.) | IV (dl/g) after melt polymerization | Terminal COOH group amount (eq/t) after melt polymerization | Solid-state polymerization conditions | ΔIV (dl/g/hr) | IV (dl/g) after solid-state polymerization | Terminal COOH group amount (eq/t) after solid-state polymerization | Log (R) | Film thickness (μm) | Retention half-life of elongation at break (hr) |
|---|---|---|---|---|---|---|---|---|---|---|---|---|---|---|---|---|---|---|
| Ex 1 | PET | 9.0 | 75 | 60 | 0.15 | Ti→Mg→P | Added after dissolved in 25° C. EG | 3.8 | 278 | 0.64 | 21 | 210° C., 50 Pa, 30 hr | 0.0182 | 0.80 | 14 | 6.5 | 175 | 3000 |
| Ex 2 | PET | 9.0 | 75 | 60 | 0.15 | Mg→Ti→P | Added after dissolved in 25° C. EG | 3.8 | 278 | 0.64 | 21 | 210° C., 50 Pa, 30 hr | 0.0182 | 0.80 | 14 | 6.6 | 175 | 3000 |
| Ex 3 | PET | 9.0 | 75 | 60 | 0.15 | Ti→Mg→P | Added after dissolved in 25° C. EG | 3.8 | 278 | 0.64 | 21 | 210° C., 50 Pa, 30 hr | 0.0182 | 0.80 | 14 | 6.5 | 175 | 3000 |
| Ex 4 | PET | 6.3 | 75 | 60 | 0.11 | Ti→Mg→P | Added after dissolved in 25° C. EG | 3.8 | 278 | 0.58 | 30 | 210° C., 50 Pa, 30 hr | 0.0180 | 0.74 | 24 | 6.5 | 125 | 2000 |
| Ex 5 | PET | 11.0 | 75 | 60 | 0.18 | Ti→Mg→P | Added after dissolved in 25° C. EG | 3.8 | 278 | 0.68 | 25 | 210° C., 50 Pa, 30 hr | 0.0185 | 0.84 | 15 | 6.6 | 125 | 2000 |
| Ex 6 | PET | 9.0 | 75 | 85 | 0.11 | Ti→Mg→P | Added after dissolved in 25° C. EG | 3.8 | 278 | 0.58 | 30 | 210° C., 50 Pa, 30 hr | 0.0175 | 0.72 | 24 | 6.4 | 125 | 2000 |
| Ex 7 | PET | 9.0 | 75 | 48 | 0.19 | Ti→Mg→P | Added after dissolved in 25° C. EG | 3.8 | 278 | 0.68 | 28 | 210° C., 50 Pa, 30 hr | 0.0184 | 0.82 | 17 | 6.5 | 55 | 2000 |
| Ex 8 | PET | 9.0 | 75 | 60 | 0.15 | Ti→Mg→P | Added after dissolved in 25° C. EG | 3.8 | 278 | 0.60 | 26 | 210° C., 50 Pa, 30 hr | 0.0175 | 0.72 | 19 | 6.5 | 55 | 2500 |
| Ex 9 | PET | 9.0 | 75 | 60 | 0.15 | Ti→Mg→P | Added after dissolved in 80° C. EG | 1.5 | 278 | 0.64 | 21 | 210° C., 50 Pa, 30 hr | 0.0182 | 0.80 | 14 | 6.4 | 55 | 3000 |
| Ex 10 | PET | 9.0 | 75 | 60 | 0.15 | Ti→Mg→P | Added after dissolved in 25° C. EG | 8.0 | 278 | 0.64 | 22 | 210° C., 50 Pa, 30 hr | 0.0185 | 0.80 | 15 | 6.6 | 55 | 2500 |
| Ex 11 | PET | 9.0 | 75 | 60 | 0.15 | Ti→Mg→P | Added after dissolved in 25° C. EG | 3.8 | 270 | 0.64 | 18 | 210° C., 50 Pa, 30 hr | 0.0182 | 0.80 | 11 | 6.5 | 55 | 3500 |

TABLE 1-continued

| | Resin | Ti (ppm) | Mg (ppm) | P (ppm) | Ti/P | Addition order | P compd addition method | P compd content in addition solution (% by mass) | Polymerization temperature in condensation polymerization step (third condensation polymerization tank) (°C.) | IV (dl/g) after melt polymerization | Terminal COOH group amount (eq/t) after melt polymerization | Solid-state polymerization conditions | ΔIV (dl/g/hr) | IV (dl/g) after solid-state polymerization | Terminal COOH group amount (eq/t) after solid-state polymerization | Log (R) | Film thickness (μm) | Retention half-life of elongation at break (hr) |
|---|---|---|---|---|---|---|---|---|---|---|---|---|---|---|---|---|---|---|
| Ex 12 | PET | 9.0 | 75 | 60 | 0.15 | Ti→Mg→P | Added after dissolved in 25° C. EG | 3.8 | 260 | 0.64 | 15 | 210° C., 50 Pa, 30 hr | 0.0182 | 0.80 | 8 | 6.5 | 300 | 4000 |
| Ex 13 | PET | 9.0 | 75 | 60 | 0.15 | Ti→Mg→P | Added after dissolved in 25° C. EG | 3.8 | 260 | 0.64 | 15 | 210° C., 10 Pa, 30 hr | 0.0182 | 0.80 | 6 | 6.4 | 300 | 4500 |
| Ex 14 | PET | 9.0 | 75 | 60 | 0.15 | Ti→Mg→P | Added after dissolved in 25° C. EG | 3.8 | 260 | 0.64 | 15 | 210° C., N₂, 30 hr | 0.0182 | 0.80 | 6 | 6.5 | 300 | 4500 |
| Ex 15 | PET | 9.0 | 75 | 60 | 0.15 | Ti→Mg→P | Added after dissolved in 25° C. EG | 3.8 | 260 | 0.50 | 15 | 210° C., 50 Pa, 50 hr | 0.0182 | 0.80 | 4 | 6.5 | 300 | 5000 |
| Ex 16 | PEN | 9.0 | 75 | 60 | 0.15 | Ti→Mg→P | Added after dissolved in 25° C. EG | 3.8 | 278 | 0.58 | 21 | 210° C., 50 Pa, 30 hr | 0.0179 | 0.73 | 15 | 6.5 | 175 | 5000 |
| Ex 17 | PBT | 9.0 | 75 | 60 | 0.15 | Ti→Mg→P | Added after dissolved in 25° C. BD | 3.8 | 278 | 0.57 | 21 | 210° C., 50 Pa, 30 hr | 0.0172 | 0.71 | 12 | 6.4 | 175 | 5000 |
| Ex 18 | PET | 6.0 | 75 | 32 | 0.19 | Ti→P | Added after dissolved in 25° C. EG | 3.8 | 278 | 0.63 | 21 | 210° C., 50 Pa, 30 hr | 0.0180 | 0.80 | 14 | 7.4 | 175 | 3000 |
| Comp. Ex 1 | PET | 9.0 | 75 | 60 | 0.15 | P→Ti→Mg | Added after dissolved in 25° C. EG | 3.8 | 278 | 0.29 | 52 | — | 0.0090 | — | — | 6.5 | — | — |
| Comp. Ex 2 | PET | 9.0 | 75 | 60 | 0.15 | Ti→P→Mg | added after dissolved in 25° C. EG | 3.8 | 278 | 0.28 | 48 | — | 0.0088 | — | — | 6.5 | — | — |
| Comp. Ex 3 | PET | 9.0 | 75 | 60 | 0.15 | P→Mg→Ti | Added after dissolved in 25° C. EG | 3.8 | 278 | 0.68 | 23 | 210° C., 50 Pa, 30 hr | 0.0343 | 0.85 | 11 | 6.5 | 175 | 1500 |

TABLE 1-continued

| | Resin | Ti (ppm) | Mg (ppm) | P (ppm) | Ti/P | Addition order | P compd addition method | P compd content in addition solution (% by mass) | Polymerization temperature in condensation polymerization step (third condensation polymerization tank) (°C.) | IV (dl/g) after melt polymerization | Terminal COOH group amount (eq(t) after melt polymerization | Solid-state polymerization conditions | ΔIV (dl/g/hr) | IV (dl/g) after solid-state polymerization | Terminal COOH group amount (eq(t) after solid-state polymerization | Log (R) | Film thickness (μm) | Retention half-life of elongation at break (hr) |
|---|---|---|---|---|---|---|---|---|---|---|---|---|---|---|---|---|---|---|
| Comp. Ex 4 | PET | 9.0 | 75 | 60 | 0.15 | Mg→P→Ti | Added after dissolved in 25°C. EG | 3.8 | 278 | 0.68 | 23 | 210°C., 50 Pa, 30 hr | 0.0343 | 0.85 | 11 | 6.5 | 175 | 1500 |
| Comp. Ex 5 | PET | 9.0 | 75 | 100 | 0.09 | Ti→Mg→P | Added after dissolved in 25°C. EG | 3.8 | 278 | 0.21 | 36 | — | 0.0088 | — | — | 6.5 | — | — |
| Comp. Ex 6 | PET | 9.0 | 75 | 40 | 0.23 | Ti→Mg→P | Added after dissolved in 25°C. EG | 3.8 | 278 | 0.69 | 30 | 210°C., 50 Pa, 30 hr | 0.0201 | 0.85 | 20 | 6.5 | 175 | 1500 |
| Comp. Ex 7 | PET | 5.0 | 75 | 50 | 0.10 | Ti containing resin pellets and P containing resin pellets were prepared separately and then blended | | | 285 | 0.62 | 31 | 210°C., 50 Pa, 30 hr | 0.0235 | 0.85 | 14 | 6.5 | 175 | 2000 |
| Comp. Ex 8 | PET | 5.0 | 0 | 10 | 0.50 | Ti compd and P compd were directly added at the same time | Directly added to reaction liquid | | 280 | 0.58 | 48 | 210°C., 50 Pa, 30 hr | 0.0112 | 0.69 | 38 | 6.5 | 175 | 1000 |
| Comp. Ex 9 | PET | 13 | 65 | 56 | 0.23 | Ti→Mg→P | | | 290 | 0.58 | 28 | 210°C., 50 Pa, 30 hr | 0.0187 | 0.74 | 14 | 6.5 | 175 | 2000 |
| Comp. Ex 10 | PET | 9.0 | 0 | 0 | ∞ | Ti | — | — | 278 | 0.68 | 21 | 210°C., 50 Pa, 30 hr | 0.0360 | 0.83 | 10 | 7.6 | 175 | 2000 |
| Comp. Ex 11 | PET | 9.0 | 75 | 0 | ∞ | Ti→Mg | — | — | 278 | 0.68 | 25 | 210°C., 50 Pa, 30 hr | 0.0334 | 0.83 | 14 | 6.6 | 175 | 1500 |

From the results shown in Table 1, it is understood that the polyester films obtained from the polyester resin compositions prepared in the respective Examples are more excellent in hydrolysis resistance when compared with Comparative Examples. This means that the polyester films for solar cells to which the polyester films prepared in the Examples are applied exhibit excellent weather resistance and that the solar cell power generation module having such a polyester film provides stable power generation performance over a long period of time.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of producing a polyethylene terephthalate resin composition, comprising:
   (A) reacting a dicarboxylic acid component and a diol component through an esterification reaction to obtain an esterification reaction product;
   (B) performing a polycondensation reaction of the esterification reaction product to obtain a condensation polymerization product; and
   adding a phosphorus compound selected from the group consisting of trimethyl phosphate and triethyl phosphate to the reaction mixture from step (A), before the esterification reaction in step (A) is terminated but after an organic chelate titanium complex comprising an acid selected from the group consisting of citric acid, lactic acid, trimellitic acid and malic acid and a compound containing at least one metal selected from the group consisting of an alkali metal, an alkaline earth metal, iron-group metal, manganese, tin, lead and zinc, are added to the reaction mixture from step (A), so as to satisfy the following formula (1) and formula (2):

$$0.10 < Ti/P < 0.20 \quad (1)$$

wherein Ti/P represents a mass content ratio of titanium element to phosphorus element in the polyethylene terephthalate resin composition; and $$0.0172 < \Delta IV \leq 0.0185 \text{ (dL/g/hr)} \quad (2)$$

wherein $\Delta IV$ represents an increase in an intrinsic viscosity of the polyethylene terephthalate resin composition per hour under conditions of 225° C. and 50 Pa;

wherein the addition of the compound containing at least one metal to the reaction mixture from step (A) occurs after the organic chelate titanium complex has been added, and before the esterification reaction in step (A) is terminated.

2. The method of producing a polyethylene terephthalate resin composition according to claim 1, wherein the addition of the phosphorus compound is performed by adding an addition solution, which is prepared by dissolving the phosphorus compound in a solution containing the diol component at about 25° C.

3. The method of producing a polyethylene terephthalate resin composition according to claim 2, wherein the content of the phosphorus compound in the addition solution is from 1% by mass to 10% by mass with respect to a total mass of the addition solution.

4. The method of producing a polyethylene terephthalate resin composition according to claim 1, wherein the polycondensation temperature is 280° C. or lower.

5. The method of producing a polyethylene terephthalate resin composition according to claim 1, further comprising (C) performing solid-state polymerization of the condensation polymerization product obtained in step (B).

6. The method of producing a polyethylene terephthalate resin composition according to claim 5, wherein the solid-state polymerization is performed under a pressure of from 1 Pa to 1000 Pa.

7. The method of producing a polyethylene terephthalate resin composition according to claim 5, wherein the solid-state polymerization is performed in a nitrogen atmosphere.

8. The method of producing a polyethylene terephthalate resin composition according to claim 1, wherein the mass content ratio of titanium element to phosphorus element is $0.10 < Ti/P < 0.15$.

9. The method of producing a polyethylene terephthalate resin composition according to claim 1, where the organic chelate titanium complex is a citric acid chelate titanium complex, the phosphorus compound is trimethyl phosphate, and the metal compound is a magnesium compound.

* * * * *